US011340321B2

(12) United States Patent
Popescu

(10) Patent No.: US 11,340,321 B2
(45) Date of Patent: May 24, 2022

(54) MAGNETIC RESONANCE TOMOGRAPHY SYSTEM

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 56 days.

(21) Appl. No.: 16/869,844

(22) Filed: May 8, 2020

(65) Prior Publication Data

US 2020/0355764 A1 Nov. 12, 2020

(30) Foreign Application Priority Data

May 9, 2019 (EP) .................................. 19173532

(51) Int. Cl.
*G01R 33/34* (2006.01)
*G01R 33/42* (2006.01)
*G01R 33/56* (2006.01)

(52) U.S. Cl.
CPC ....... *G01R 33/34007* (2013.01); *G01R 33/42* (2013.01); *G01R 33/5608* (2013.01)

(58) Field of Classification Search
CPC .............. G01R 33/42; G01R 33/34007; G01R 33/5608
See application file for complete search history.

(56) References Cited

U.S. PATENT DOCUMENTS

| 4,864,240 | A | | 9/1989 | Young | |
|---|---|---|---|---|---|
| 5,490,513 | A | * | 2/1996 | Damadian | G01R 33/341 600/415 |
| 5,606,970 | A | * | 3/1997 | Damadian | G01R 33/381 600/415 |
| 5,614,880 | A | | 3/1997 | Palkovich et al. | |
| 5,623,927 | A | * | 4/1997 | Damadian | G01R 33/341 600/415 |
| 5,664,569 | A | * | 9/1997 | Damadian | G01R 33/341 600/421 |
| 5,793,209 | A | | 8/1998 | Kondo et al. | |
| 5,977,771 | A | | 11/1999 | Petropoulos | |

(Continued)

FOREIGN PATENT DOCUMENTS

| DE | 19610266 A1 | 9/1996 |
|---|---|---|
| EP | 0311294 A2 | 4/1989 |

(Continued)

OTHER PUBLICATIONS

Epstein C. L. et al: "A novel technique for imaging with inhomogeneous fields"; Journal of Magnetic Resonance; Academic Press; Orlando; FL; US; Bd. 183; Nr. 2; pp. 183-192; XP024919389; ISSN: 1090-7807; DOI: 10.1016/J.JMR.2006.08.012.

(Continued)

*Primary Examiner* — Dixomara Vargas
(74) *Attorney, Agent, or Firm* — Banner & Witcoff Ltd.

(57) ABSTRACT

A magnetic resonance tomography system can include a basic field magnet arrangement configured to generate a basic magnetic field (B0), and spatially separated measurement stations (M1, M2, M3, M4, M5, M6, N5, M6, Mp, Ms). The magnetic resonance tomography system can use the intended basic magnetic field (B0) collectively for the measurement stations.

18 Claims, 12 Drawing Sheets

(56) References Cited

U.S. PATENT DOCUMENTS

| | | | |
|---|---|---|---|
| 6,198,285 B1 * | 3/2001 | Kormos | A61B 5/0017 324/318 |
| 6,218,836 B1 * | 4/2001 | Vrijheid | G01R 33/28 324/318 |
| 6,302,579 B1 * | 10/2001 | Meyer | A61B 6/4429 378/195 |
| 6,385,480 B1 * | 5/2002 | Bachus | A61B 6/504 378/62 |
| 6,400,155 B2 * | 6/2002 | Kormos | A61B 5/0017 324/318 |
| 6,492,812 B1 * | 12/2002 | Debbins | G01R 33/54 324/309 |
| 7,355,499 B2 | 4/2008 | McDougall et al. | |
| 7,723,986 B2 * | 5/2010 | Gewiese | G01R 33/28 324/307 |
| 7,880,467 B2 * | 2/2011 | Rapoport | G01N 24/085 324/309 |
| 8,508,228 B2 | 8/2013 | Krieg et al. | |
| 8,595,553 B2 * | 11/2013 | Goertler | G05B 23/0283 714/26 |
| 9,995,808 B2 | 6/2018 | Grissom et al. | |
| 10,935,614 B2 * | 3/2021 | Anderson | G01R 33/3692 |
| 2004/0066194 A1 | 4/2004 | Slade et al. | |
| 2006/0279281 A1 * | 12/2006 | Rapoport | G01N 24/085 324/308 |
| 2008/0086023 A1 * | 4/2008 | Gewiese | G01R 33/28 588/260 |
| 2017/0108569 A1 * | 4/2017 | Harvey | G01R 33/422 |
| 2021/0156936 A1 * | 5/2021 | Popescu | G01R 33/34084 |
| 2021/0156937 A1 * | 5/2021 | Popescu | G01R 33/4816 |

FOREIGN PATENT DOCUMENTS

| | | |
|---|---|---|
| EP | 0913699 B1 | 12/2005 |
| JP | S61159950 A | 7/1986 |
| JP | H10234704 A | 9/1998 |

OTHER PUBLICATIONS

European Search Report dated Nov. 26, 2019, for Application No. 19173532.3.

European Search Report dated Feb. 28, 2020, for Application No. 19173532.3.

* cited by examiner

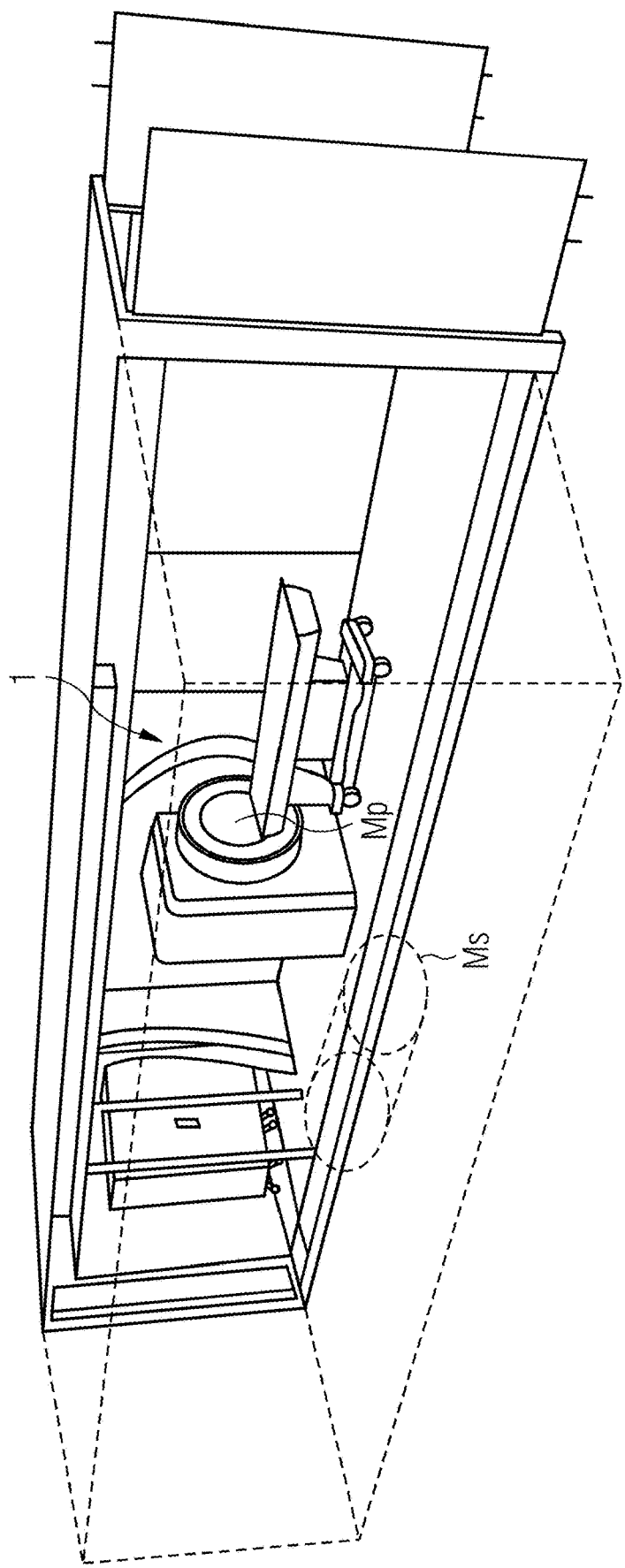

MAGNETIC RESONANCE TOMOGRAPHY SYSTEM

CROSS REFERENCE TO RELATED APPLICATIONS

This patent application claims priority to European Patent Application No. 19173532.3, filed May 9, 2019, which is incorporated herein by reference in its entirety.

BACKGROUND

Field

The disclosure relates to a magnetic resonance tomography system ("MR system"), a measuring device for a magnetic resonance tomography system and a method for measuring raw data for a magnetic resonance tomography scan.

Related Art

With costs amounting to several million euros in some instances, whole-body MR scanners are currently among the most expensive devices available for medical imaging. Typically, these scanners employ a strong superconducting magnet which may easily be several metric tons in weight. The manufacturing and operating costs of such magnets often account for between 70% and 80% of the total system costs.

The basic magnetic field generated by the device is so strong that it can also violently propel solid metal objects such as e.g. a patient chair in the examination room. In the early eighties, MR scanners were generally not shielded, and the magnet rooms were extremely largely dimensioned (2 to 4 times as large as the imaging rooms) in order to capture the large stray magnetic fields. The zone of said stray magnetic fields is known as the "controlled area", in which the intensity of the static magnetic field is greater than 0.5 G or 50 µT.

In order to reduce the stray field, today's actively shielded basic field magnet constructions contain at least one additional set of magnetic coils which counteract the external field generated by the main coils. For example, the main windings would be capable of generating a basic magnetic field of 2.0 T, whereas the shielding coils generate a field of 0.5 T in the opposite direction. The net effect is a basic magnetic field of 1.5 T in the center of the basic field magnet. Although the shielding reduces the usable field strength in the working volume, the reduction effect on the stray field is substantially greater. However, this significantly reduces the efficiency of the basic field magnet, which necessitates a higher current through the magnetic coils and/or a higher number of windings per coil. Both lead to increased costs.

In order to keep these costs low, the manufacturers are obliged to increase the length of the basic field magnet and limit the patient tunnel opening (the "bore"). However, this means that whole-body MR scanners enclose the patient in the most confined of spaces. This is a major problem for patients suffering from claustrophobia, impacting and limiting the benefits of MR. Clinical studies have shown that up to 15% of all MR patients suffer from anxiety states based on claustrophobia, and consequently either cannot be examined or require sedation. With an annual total of 80 million MR procedures globally, around 2 million MR examinations are not completed due to claustrophobia. In financial terms, assuming a value of 500 € per procedure, this is equivalent to a loss of 1 billion euros.

A further disadvantage is that access by medical staff to the patient during the imaging session is very restricted or not possible due to the magnetic field and the space constraints. This has led in the prior art to interventional MRI having no significant clinical application up till now.

Numerous trials representing a multiplicity of low-field and open-access magnet constructions are known from the prior art, all aimed at lowering magnet costs, improving access to the patient or avoiding claustrophobic effects. Generally, these scanners employ either permanent magnets or electromagnets operated at room temperature. The static magnetic field strength lies at well below 0.5 T.

Oftentimes, the imaging volume of alternative scanners is severely limited because the magnetic poles are located very close to the body of the patient, which conflicts with the goals of open access or a largely unrestricted patient space. For example, US 2004/0066194 A1 discloses a unilateral MR scanner architecture or an MR scanner architecture contained in the patient table platform. In this case, however, due to the small electromagnet, the magnetic field intensity of the static basic magnetic field B0 decreases sharply at a distance from the basic field magnet. This intensity ranges from 0.5 T at the magnet surface up to 0.05 T at a distance of 30 cm (a factor of ×10 over a gap of 30 cm). Furthermore, bulky electromagnets having a massive iron yoke are required for such magnets, considerably restricting access to the patient. Also, the magnetic field is strongly nonlinear and anisotropic in all spatial directions. A further disadvantage is that the imaging volume is limited to approx. 30×30×20 cm.

Furthermore, non-superconducting electromagnets become hot during operation and require effective cooling. In order to avoid ion contamination, this cooling is often realized by means of hollow conductors and water treatment systems, which likewise restrict the openness of a scanner.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 15 shows a mobile or modular variant of an MR system in a container arrangement according to an exemplary embodiment.

Figure 1:
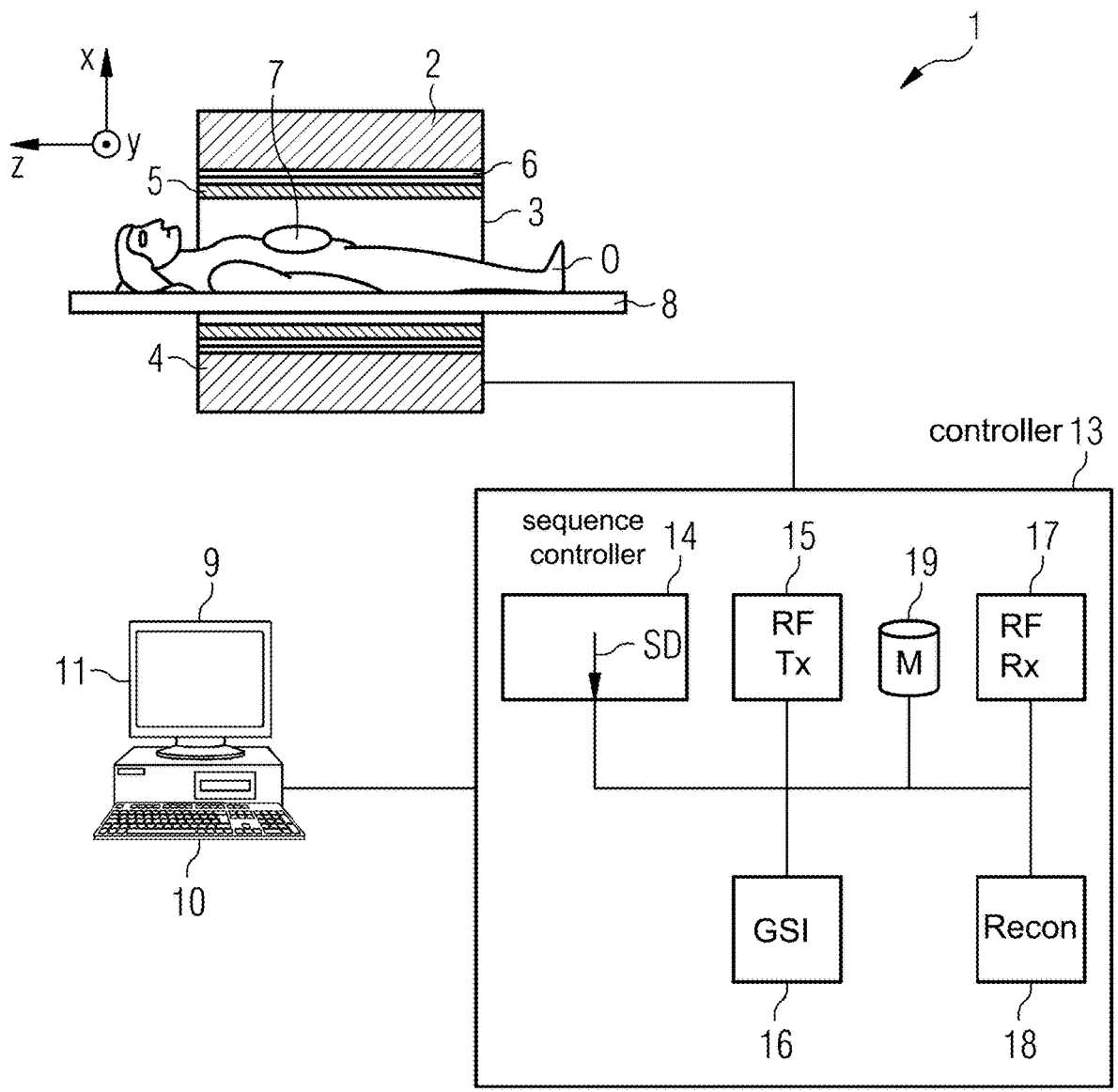
FIG. 1 shows a schematic view of a conventional magnetic resonance tomography system.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

It is an object of the present disclosure to disclose an alternative magnetic resonance tomography system by means of which the above-described disadvantages are avoided or at least reduced.

The magnetic resonance tomography system according to the disclosure comprises a basic field magnet arrangement (which may also be referred to as a "basic field magnet system") for generating a basic magnetic field as well as a plurality of spatially separated measurement stations.

The basic field magnet arrangement comprises those basic field magnets that generate the intended basic magnetic field. This may be e.g. a known basic field magnet in the form of a solenoid. The measurement stations are configured for performing MR measurements, i.e. they comprise (at least temporarily, as will be explained later) the necessary infrastructure therefor, such as e.g. the aforementioned measuring devices. In this respect, the measurement stations may also be referred to as "magnetic resonance measurement stations" (MR measurement stations) in order to emphasize this fact.

In an exemplary embodiment, the magnetic resonance tomography system is configured to use the intended basic magnetic field (deliberately or intentionally) collectively for the measurement stations. There are therefore not simply two separate MR systems available, but rather one and the same basic magnetic field is used. Two different magnetic fields, e.g. generated by two completely separate MR systems with independent basic field magnet systems, the stray fields of which (usually, as mentioned above, greatly reduced by means of a suitable shielding means) possibly mutually interfere with one another unintentionally or accidentally, are not part of the disclosure. In an exemplary embodiment, a shielding means may be dispensed with in the case of the basic field magnet or its shielding may at least be weaker than normal in order to shield the basic magnetic field e.g. only outside of a radius of action in which the measurement stations are arranged.

As will be explained in more detail later, the disclosure therefore enables additional examinations to be carried out in parallel with the performance of a magnetic resonance tomography scan or MR examination. This means on the one hand that more patients can be examined and a return on the investment costs for an MR system is achieved more quickly. On the other hand, this affords the opportunity to increase the number of MR measurement stations available even in sectors that are not so financially strong. The resource expenditure for each MR measurement station can also be reduced.

For this purpose, a preferred magnetic resonance tomography system therefore comprises at least two measuring devices which are configured at least for receiving MR signals, i.e. for the acquisition of raw data. In an exemplary embodiment, the measuring devices are also configured for applying an excitation pulse sequence in order to induce the MR signals. At the same time, each of the measuring devices is configured for performing a measurement within the scope of a magnetic resonance tomography scan at one of the measurement stations, which are preferably independent of one another and if necessary can also perform measurements simultaneously, as will be explained further hereinbelow.

An inventive measuring device for measuring by means of an inventive magnetic resonance tomography system at a measurement station comprises at least one RF transmit system (e.g. a transmit antenna and a transmitter) and an RF receive system (e.g. a receive antenna and a receiver) and preferably in addition a gradient system (in particular an unshielded gradient system at a secondary measurement station) and/or a shim coil system. The RF transmit system and the RF receive system may also share some common components, for example use a common RF transmit/receive coil. Depending on construction, the RF transmit and/or RF receive system of a measuring device may have a whole-body coil or local coil. In an exemplary embodiment, depending on the type of measurement station, the measuring device may also be embodied as a mobile measuring device in order, as mentioned, to equip a measurement station provided herefor at least temporarily with a measuring device while a magnetic resonance tomography scan is being performed. A shim coil system or a gradient system, which can also be used as a shim coil system, is of advantage in particular in the case of a "secondary" measurement station (explained later in greater detail) because there it can compensate for unwanted inhomogeneities in the stray magnetic field.

The mobile aspect of the measuring device may go so far that the measuring device is designed in such a way that it can be held or carried in one hand. In an exemplary embodiment, its dimensions are smaller than 20 cm×20 cm×20 cm and its weight is preferably less than 5 kg. This is by all means achievable since, as has already been said above, shielding means can largely be dispensed with. Just one RF shield on almost all sides is advantageous for the mobile measuring device. One section should not be shielded by means of said RF shield in this case so that it can serve as a field of view. In spite of the shielding of the measuring device itself, it is of advantage to examine the patient by means of the measuring device in an RF-shielded room or a correspondingly shielded cabin.

With regard to the sequencing or timing of measurement steps, said measuring device can be controlled by a (possibly higher-ranking) controller, such a controller preferably being designed in such a way that a coordination of a plurality of measuring devices can be realized. The controller is described in greater detail hereinbelow. In this context, a centrally coordinated control is extremely advantageous. It is particularly preferred in this regard to perform an alignment of gradients of the individual measurements so that these do not e.g. mutually influence one another.

An inventive method for measuring raw data for a magnetic resonance tomography scan, in particular for magnetic resonance tomography imaging, comprises the following steps:

Positioning at least one object in a measurement station of an inventive magnetic resonance tomography system. This object may be in particular a patient or a test volunteer, or even an inanimate body, e.g. a phantom.

Generating a basic magnetic field by means of the basic field magnet arrangement of the magnetic resonance tomography system.

Measuring the raw data. What is meant by this is a typical MR excitation of at least one region of interest (RoI) of the object by means of suitable RF signals and an acquisition of the MR signals induced thereby from the RoI. A spatial encoding can be achieved by means of inhomogeneities of the basic magnetic field and/or by means of additional gradient fields.

Following appropriate processing, this raw data is preferably used for imaging, i.e. for generating magnetic resonance image data, but can by all means serve also for obtaining other results.

In particular, as will be explained in more detail later with reference to different embodiment variants, the disclosure also relates to the use of the stray magnetic field of a basic magnetic field (which is generated per se for a "primary" measurement station and has its "main field region" here) for performing a raw data measurement at a "secondary" measurement station which is arranged in the stray field or stray field region of said basic magnetic field. In this context, the basic magnetic field in the intended measurement region or "field of view" (FoV) is regarded as the main field region. This measurement region may also be referred to as the "imaging volume". The area regarded as the main field region is preferably the basic magnetic field in a sphere with a diameter of approx. 50 cm in the center of the measurement region, and the remaining area of the magnetic field is regarded as a stray field region.

In order to actuate all components of the basic field magnet arrangement and the measuring device(s) of the magnetic resonance tomography system, the latter may include a controller, and this, as mentioned, may preferably also be embodied in such a way that the measurements at different measurement stations are sequenced in a coordinated manner.

According to an exemplary embodiment, the controller of an MR system is embodied for coordinating the measuring devices in such a way that it coordinates the timing of measurements at different measurement stations so that no interferences occur between these measurements. In particular, the effect of field fluctuations (e.g. due to gradients) on measurements can be minimized by this means.

Some of the components of the controller, in particular components responsible for coordinating the measurements, may be realized wholly or in part in the form of software modules in a processor of a corresponding controller of an MR system. An implementation of such components in large part in the form of software has the advantage that controllers already used previously in the prior art can also be easily upgraded by means of a software update in order to operate in the inventive manner.

The controller may also comprise a plurality of subsidiary controllers which are assigned for example to different measurement stations and/or measuring devices and which are preferably able to communicate with one another for coordination purposes and/or are coordinated by means of a higher-ranking master controller. In particular, therefore, a measuring device may in each case also have its own dedicated controller, in particular also with a sequence controller and possibly even a separate reconstructor.

A magnetic resonance tomography system according to an exemplary embodiment is, as mentioned, configured to allow measurements for magnetic resonance tomography scans to be performed simultaneously at at least two of the measurement stations in the common basic magnetic field. This means that two objects may be examined simultaneously at said measurement stations or where appropriate other measurements may be performed. For this, it is however not absolutely necessary that a raw data measurement, i.e. an RF excitation and/or a raw data acquisition, must be performed at the same time, as this may also be coordinated in a suitable manner, e.g. interleaved.

In that respect, therefore, a "simultaneous performance of magnetic resonance tomography scans" should be understood to mean that a "magnetic resonance tomography scan" (sometimes also called simply "imaging") includes the period of time in which all measures belonging to a typical MR measurement fall: positioning of the patient, administration of a contrast agent if necessary, application of a pulse sequence, measurement of the MR signals, and possibly reconstruction of an image, discharging the patient from the examination room, etc., in other words all processes that occupy the MR system. In this case the raw data measurement comprises—as part of the magnetic resonance tomography scans—only the application of a pulse sequence or an RF excitation and a measurement of the MR signals induced thereby. The acquisition of the MR signals itself is also referred to as "raw data acquisition".

A simultaneous performance of magnetic resonance tomography scans therefore means that the time periods of imaging sessions at different measurement stations may coincide or overlap in time. It may be of advantage in this case if, within this commonly occupied time period, active processes that may affect the magnetic field or another measurement are performed separately from one another. Passive processes, i.e. processes that have no effect on another measurement, such as e.g. an advancing movement of a patient table or the administration of a contrast agent, may, as mentioned, by all means be performed simultaneously as a general rule. However, this does not preclude the possibility that active processes or the measurement of raw data may also be performed simultaneously at different measurement stations, depending on the design of the measurement stations and their arrangement relative to one another.

For example, measurements could be performed alternately in order to avoid mutual interference, i.e. a measurement is always performed at one of the measurement stations (i.e. RF pulses are transmitted and raw data is acquired) while a patient is currently being positioned at another of the measurement stations, a shift in the position of the patient is performed or a contrast agent is administered. Indeed, it is well known that the preparation and follow-up time of the examination workflow also ties up the magnetic resonance tomography system for a not inconsiderable period of time, which could therefore be used more effectively.

A magnetic resonance tomography system according to a first main variant of an exemplary embodiment comprises a special basic magnetic field arrangement and a plurality of measurement stations within the "main field region" of the basic magnetic field of said basic field magnet arrangement or even within the basic field magnet arrangement itself.

This basic field magnet arrangement comprises a plurality of (active) basic field magnet segments spatially separated from one another, each of which is designed (during operation) to generate an intended magnetic field having a defined segment main field direction.

The basic field magnet segments in this case constitute parts of the basic field magnet arrangement and comprise at least one basic field magnet that is defined by means of at least one magnetic coil. However, a plurality of individual basic field magnets or magnetic coils may also be combined to form a basic field magnet segment. Even if a yoke is not ruled out in a basic field magnet, it is nonetheless of advantage at least for certain applications to design the basic field magnets to be as light as possible, i.e. to dispense with a yoke. In other words, the magnetic coils of the basic field magnet segments are preferably embodied without an iron core, possibly with a free space in the core region, or the basic field magnet segments are preferably realized without an iron yoke. The basic field magnets may be embodied as conventional electromagnets or as superconducting electromagnets. Since the focus here is on the magnetic coils of the basic field magnets, the basic field magnet segments may also be referred to in particular as "basic field magnet coil segments".

An "intended" magnetic field (and also an intended basic magnetic field) is that magnetic field which forms during operation of a magnet according to the intended purpose, i.e. when a current flows through the magnet. The shape is predetermined by the design of the magnet, the strength of the intended magnetic field scaling in intensity at different current strengths. Since Helmholtz coils are generally used in the technical environment of the MR systems, the intended magnetic field of a basic field magnet is in most cases that of a solenoid. The intended magnetic field of a basic field magnet segment or of the basic field magnet arrangement may be more complex, at least when the basic field magnet segment has a different shape from that of a Helmholtz coil.

The "main field direction" of a magnetic field of a magnet is indicated by that vector that characterizes the magnetic field profile within the magnet. In other words, it is not the stray field that is considered, but the field which is primarily relevant within the context of the known MR systems. In a solenoid magnet, the main field direction would stand perpendicular to the end face of the magnet (solenoid), whereas in a toroidal magnet, the main field direction of the magnetic field in the interior of the magnet would point to a circular trajectory. In an arbitrarily shaped magnet, the main field direction reflects the profile of the resulting magnetic field vector of the strongest part of the magnetic field (without the stray field). The mentioned segment main field direction is the main field direction of a magnetic field of a basic field magnet segment.

In a basic field magnet arrangement according exemplary embodiment, at least two of the basic field magnet segments are arranged relative to one another in such a way that the segment main field directions of their intended magnetic fields extend at a deflection angle to one another. This deflection angle is in this case obviously greater than 0°, since of course no deflection would otherwise be achieved. The relevant basic field magnet segments are furthermore arranged relative to one another in such a way that the intended magnetic fields of the basic field magnet segments result in an intended basic magnetic field (of the basic field magnet arrangement). The basic field magnet segments therefore collectively form the basic magnetic field during operation.

The basic field magnet segments are in this case arranged in such a way that the basic magnetic field has a basic magnet main field direction with an annular profile.

In this context "annular" denotes a closed, ring-shaped profile, preferably in a single spatial plane, preferably in a circular shape or at least a shape having rounded corners. Such an annular magnetic field has a smaller stray field than the magnetic field of a conventional solenoid. The stray field becomes smaller the more basic field magnet segments are used or the more extended the basic field magnet segments are in the direction of the magnetic field profile. Compared with a C magnet, the overall weight of the preferred basic field magnet arrangement is smaller by a multiple, in particular since an iron yoke, which is usually required in C magnets in order to reduce the stray field, can be dispensed with in this case.

In an exemplary embodiment, therefore, magnetic resonance tomography scans can be performed in parallel at more than one measurement station within the common annular basic magnetic field (i.e. in its main field region).

In an exemplary embodiment, the magnetic field is in this case a "toroidal" magnetic field. Included in what is to be considered as a "toroidal" magnetic field, i.e. a magnetic field which is similar to the magnetic field of a toroid, are, in addition to (substantially circular) toroid-shaped magnetic fields themselves, in particular also other inherently closed magnetic fields which have the shape of an ellipse, a rectangle with rounded corners or a shape formed from circular segments and "inserted" straight sections (in particular the shape of a simple racetrack with 180° bends and two straight sections running in opposite directions).

According to an exemplary embodiment, such a basic field magnet arrangement comprises at least three basic field magnet segments (preferably at least four, further preferably at least six or particularly preferably at least eight), which are arranged in such a way that the basic magnet main field direction has the shape of a planar ring, preferably substantially of a toroid or a toroid-like shape, in particular the shape of a toroid with inserted straight sections (see above). This means that the segment main field directions of the magnetic fields of the basic field magnet segments all lie in a single common spatial plane.

In an exemplary embodiment, the deflection angle of the segment main field directions between at least two adjacent basic field magnet segments amounts to at least 5°, preferably at least 30°, particularly preferably at least 45°. This means that the basic field magnet segments (in respect of their segment main field direction) are correspondingly arranged tilted relative to one another. In this respect it is preferred that basic field magnet segments face toward one another with one of their side walls and the winding or coil planes of adjacent basic field magnet segments are tilted relative to one another. The side walls are in this case the lateral walls in which electric current conductors of the magnet windings run. The side walls could also be referred to as edges. It is therefore not the end faces of a magnet that are to be understood as side walls (from which the magnetic field exits and which lie e.g. substantially parallel to a winding plane of a magnetic coil of the basic field magnet segment), but the sides in a direction transverse to the segment main field direction of the basic field magnet segment.

In an exemplary embodiment, the basic field magnet arrangement may comprise at least one group of basic field magnet segments which are arranged in a star shape around at least one spatial axis, one side wall or edges of the respective basic field magnet segment pointing toward said central axis in each case. This arrangement is preferably rotationally symmetric, a rotational symmetry of 360°/N particularly preferably being present given N basic field magnet segments (in a group). With six basic field magnet segments, the basic field magnet arrangement would appear e.g. as a six-pointed star. However, a star shape may also comprise a partially regular arrangement of basic field magnet segments, e.g. such that the basic field magnet segments are all arranged at regular intervals within a semicircle. Also preferred is an arrangement of a plurality of said partially regular star shapes around multiple central axes or spatial axes, e.g. two oppositely disposed semicircular arrangements spaced apart from one another somewhat in order to generate overall e.g. the already mentioned basic magnetic field in the shape of a toroid with inserted straight sections.

In an exemplary embodiment, the basic field magnet arrangement comprises a basic field magnet segment or a group of basic field magnet segments which is constructed in order to deflect the basic magnet main field direction of the intended basic magnetic field through a total deflection angle of at least 60°, preferably of at least 90°, further preferably of at least 180°. In an exemplary embodiment, the segment main field direction of the magnetic field of said basic field magnet segment or the resulting segment main field direction of the resulting magnetic field of said group (i.e. the segment group main field direction) in this case runs in a curve which represents a deflection through said angles. This basic field magnet segment or this one group of basic field magnet segments can be used to guide the basic magnetic field in a targeted manner.

In particular when, as described above, basic field magnet segments are arranged in a star shape or in a similar manner around a central axis in order to achieve an annularly closed profile of the basic magnet main field direction of the basic magnetic field, and the individual basic field magnet segments are constructed in such a way that they generate a magnetic field that is oriented in a spatial direction perpendicular to their segment main field direction and is substantially homogeneous (i.e. when the basic field magnet segments are constructed for example in the shape of Helmholtz coils), this can lead to a basic magnetic field whose field strength, insofar as it (steadily) decreases, is inhomogeneous in the radial direction (starting from the central axis). This is because the distance between the individual basic field magnet segments close to the spatial axis is narrower than at a radially greater distance from the central axis. In other words, the density of the field lines of the resulting basic magnetic field decreases in the radially outward direction.

In particular in order to even this out and to achieve a maximally homogeneous basic magnetic field in the radial direction also, a basic field magnet segment (preferably each of the basic field magnet segments) may have, in an exemplary embodiment of the basic field magnet arrangement, a coil winding which generates an intended magnetic field that becomes stronger toward one side of the basic field magnet segment, i.e. in a direction transverse to the segment main field direction of the basic field magnet segment. To that end, the coil winding is preferably configured in such a way that the diameter of a winding decreases in at least one spatial direction compared with its neighbor winding and its center point lies closer to one side of the annular basic magnetic field. The magnetic field of said individual basic field magnet segment therefore preferably becomes stronger toward the outer edge of the basic field magnet arrangement (e.g. toward the outer edge of the circular shape, in particular toroidal shape) in order to compensate as effectively as possible for the otherwise occurring radial inhomogeneity of the resulting basic magnetic field as a whole. It may also be said with regard to the basic field magnet segments that the windings gradually tend toward the outer side wall of a basic field magnet segment, i.e. toward the outside of the ring shape of the basic magnetic field. The exact type or topography of the winding is in this case preferably adapted accordingly to the arrangement of the basic field magnet segments relative to one another in order to achieve a suitable compensation for the inhomogeneity.

As mentioned, an exemplary embodiment of the magnetic resonance tomography system comprises a plurality of measurement stations (at least two) within a (common) basic field magnet arrangement or within a main field region of the common basic magnetic field. In particular in the case of the aforementioned basic field magnet arrangements, said measurement stations are preferably arranged therein between two basic field magnet segments in each case and/or in a patient tunnel within a basic field magnet segment.

As already mentioned above, the basic field magnet arrangement of a magnetic resonance tomography system according to an exemplary embodiment may comprise a basic field magnet segment or a group of basic field magnet segments which is constructed in order to deflect the basic magnet main field direction of the intended basic magnetic field through a total deflection angle of at least 60°, preferably of at least 90°, further preferably of at least 180°. Such a basic field magnet arrangement may in particular be used also for the aforementioned embodiment in order to deflect the basic magnet main field direction from one measurement station to another measurement station through 180° so that the basic magnet main field direction runs in opposite directions at said measurement stations.

In an exemplary embodiment, a basic field magnet segment or a group of basic field magnet segments is arranged below or above at least one measurement station or at at least one side of a measurement station, said basic field magnet segment or the group of basic field magnet segments preferably adjoining two different measurement stations.

In a magnetic resonance tomography system having multiple measurement stations according to an exemplary embodiment, a basic field magnet segment (e.g. a basic field magnet) may also preferably be embodied as a wall and/or be arranged in a wall between two measurement stations.

In an exemplary embodiment, a basic field magnet arrangement having a group of basic field magnet segments is arranged at regular intervals in a semicircle, said group deflecting the basic magnetic field through 180°, and having a further basic field magnet segment centrally arranged perpendicularly to said semicircle (i.e. effectively standing on the latter) and may be located between the two measurement stations. This will be explained in greater detail later with reference to exemplary embodiments.

Compared with traditional magnetic resonance tomography, which is based on homogeneous basic magnetic fields having rectangular and parallel field lines, this first main variant of the disclosure allows variations in terms of image acquisition techniques, in particular in signal encoding, and image reconstruction. In this case the signal encoding and the image reconstruction follow the "isofrequency surfaces", i.e. surfaces having the same frequency in the scanned regions. Said isofrequency surfaces are curved in a toroidal magnetic field and follow surfaces each having the same magnetic field strength.

A second main variant of the disclosure, which advantageously uses in particular the stray field of an MR system for the measurement, is described in greater detail below.

For this purpose, a magnetic resonance tomography system according to an exemplary embodiment comprises the following components:

At least one primary measurement station (having an infrastructure for MR measurements, at least measurement coils) which is located within the basic field magnet arrangement, in particular within a basic field magnet or between two basic field magnets, e.g. the windings of a C magnet. The basic field magnet arrangement is usually a traditional construction such as a solenoid or C magnet, as is employed in conventional MR systems, the shielding of the basic magnetic field being (at least partially) dispensed with. In this case there is usually only one primary measurement station. However, this does not rule out the possibility that a basic field magnet arrangement according to an embodiment variant of the above-explained first main variant comprising a plurality of measurement stations may also be used provided its stray magnetic field is sufficient.

At least one secondary measurement station (having, as mentioned above, an at least temporary, though in other exemplary embodiments also permanent, separate infrastructure for MR measurements, at least having measurement coils), which is disposed outside of the basic field magnet arrangement. In this case the MR system preferably comprises at least two secondary measurement stations.

According to an exemplary embodiment, the inventive magnetic resonance tomography system, the secondary measurement station is therefore located in a stray field area of the basic field magnet arrangement and consequently uses the stray field of the basic magnetic field. In the case of a solenoid as basic field magnet, for example, this can be achieved by the basic field magnet having, as mentioned, no or only a limited shielding and the secondary measurement stations being located near to the basic field magnet in the latter's stray field. This stray field is sufficient, at least for certain MR measurements, thus enabling further measurements to be conducted at the secondary measurement stations in parallel with a "main measurement" at the primary measurement station. An unshielded basic field magnet is cheaper and smaller than a shielded one, so a financial advantage is gained by dispensing with a (strong) shielding means.

What was said above with regard to the toroidal magnetic field applies similarly to the secondary measurement stations, with the difference that no additional basic field magnets or basic field magnet segments need to be used.

For example, at at least one secondary measurement station, the resulting field vectors of the intended magnetic field profiles (which hereinabove corresponds to a segment main field direction, except that here the stray field of the basic magnetic field is now meant) should be inclined by at least 30° to the intended basic magnet main field profile (e.g. the main field of a solenoid), preferably oppositely, at the position of the primary measurement station.

An advantage of this embodiment variant or second main variant is that the stray magnetic field which is formed in any case around the scanner during a primary examination can simply be used for additional examinations. Moreover, the costs for shielding of the basic field magnet can be saved in addition, since of course it is precisely the stray magnetic field that is used. A "guiding" of the basic magnetic field by means of further magnets (such as the basic field magnet segments) can possibly be performed, as has been described hereinabove.

A magnetic resonance tomography system according to an exemplary embodiment comprises at least two secondary measurement stations which are arranged on different sides of the primary measurement station and lie in a common plane with the primary measurement station.

Alternatively or in addition, a magnetic resonance tomography system according to an exemplary embodiment comprises a plurality of secondary measurement stations arranged in a star shape around the primary measurement station. Said secondary measurement stations are preferably located where the profile of the stray field extends inversely parallel to a basic magnet main field direction of the intended basic magnetic field at the primary measurement station.

In a magnetic resonance tomography system according to an exemplary embodiment, at least one measurement station, preferably a secondary measurement station, has a height adjustment facility by means of which the height of the entire measurement station and/or of the object to be examined can be adjusted.

In a magnetic resonance tomography system according to an exemplary embodiment, a secondary measurement station is arranged in a different room (examination room) from the primary measurement station and/or the secondary measurement station is separated from the primary measurement station by a wall. In this case a wall may be a (side) wall, a ceiling or a floor. In an exemplary embodiment, in this case for the wall between the primary measurement station and the secondary measurement station to be paramagnetic and/or for the walls to form a Faraday cage around a measurement station. Alternatively or in addition, the wall constitutes an acoustic separation. The walls may also have, as an advantageous embodiment variant, positionable ferromagnetic elements which can be correspondingly arranged to provide a passive shim effect. The wall is preferably non-transparent in order to provide visual shielding as well.

In an exemplary embodiment, a mobile or modular embodiment variant in which the primary measurement station and/or the secondary measurement station may be arranged in different container modules, the containers being able to be placed next to one another or stacked on top of one another. The walls of the containers are in this case preferably made of aluminum or plastic. However, they may also include the previously described positionable ferromagnetic elements. A copper grid incorporated in or mounted onto the walls is also preferred as a Faraday cage.

In a variant of an inventive magnetic resonance tomography system, a basic magnet main field direction of the basic magnetic field is preferably oriented perpendicularly to a floor surface in the region of the primary measurement station. A basic field magnet with patient tunnel would therefore stand with an end face on the floor and a patient would be examined in a standing rather than in a lying position. A number of secondary measurement stations are preferably located in the region around the basic field magnet, in which case patients can in particular also be examined there in a standing position. It would also be possible to recess such an arrangement in the floor, which would have the additional benefit of providing a good shielding of the overall system toward the exterior.

In particular, as mentioned, a height adjustment facility at the measurement stations is beneficial in such a magnetic resonance tomography system in order to position the object that is to be examined in the measurement station.

In an exemplary embodiment, the position of a secondary measurement station is chosen or the above-described basic field magnet arrangement for a measurement station is embodied in such a way that the magnetic field (the basic magnetic field and in particular also its stray field being meant in this case) at a measurement station is maximally homogeneous. In order to improve the homogeneity even further, a shim coil system can be used, in particular also at a secondary measurement station. For this purpose it is also possible to revert to prior art methods or principles on conventional magnetic resonance tomography systems, which are adapted in a suitable manner if necessary. The desired gradient fields for the measurement can then be applied by means of a gradient system, which may also be present at each measurement station or belong to each measuring device.

In other embodiments, however, it is also possible to use an existing known or clearly defined inhomogeneity of the basic magnetic field in a targeted manner, e.g. for spatial encoding of the measurement data or raw data.

To that end, in particular in the case of the aforementioned basic field magnet arrangement having the annularly extending basic magnetic field, it is possible to take advantage of the fact that where a magnetic field has a ring-shaped profile, as mentioned above, in the absence of suitable countermeasures, a stronger magnetic field usually prevails toward the center of the ring than at the edge. Generally, the decrease in field strength is antiproportional to the distance from the center of the ring. Since an inhomogeneity of the magnetic field is usually used for spatial encoding within the scope of MR measurements, although this was typically set in the prior art by means of the gradient coil system, an inhomogeneity of the basic magnetic field occurring due to the construction of the basic field magnet arrangement can be used to advantage. At least it is not absolutely necessary to apply a gradient field in the direction of the inhomogeneity, as was done hitherto in the prior art.

It should be mentioned in addition that combinations of the different variants are also possible, i.e. that for example the inhomogeneity of the basic magnetic field is used only in certain spatial directions and additional gradient fields are applied in certain spatial directions or that this is also handled differently from measurement station to measurement station.

In an exemplary embodiment, no whole-body coil is used at a secondary measurement station (i.e. whole-body coils in the form of RF coils, magnetic coils or gradient coils), but only local receive and transmit coils. This has the advantage that the wall of the measurement station can be of very thin construction. When a gradient system is used, it would then only be necessary e.g. to arrange the gradient coils in the wall. It is also of advantage to arrange the gradient coils in the examination couch, which arrangement is known as "local orthogonal planar gradient coils". In an exemplary embodiment, a measurement station has no gradient system, but instead an array composed of transmit/receive coils which are used for spatial encoding in addition to their measurement function.

In a method according to an exemplary embodiment, therefore, at least one object is also positioned in a secondary measurement station (hereinafter referred to also as a "satellite measurement station") within the scope of the present disclosure, and raw data for magnetic resonance tomography scans is measured at said secondary measurement station. This preferably happens with a, preferably mobile, measuring device according to the disclosure. It is particularly advantageous when measurements for magnetic resonance tomography scans are performed simultaneously at at least two measurement stations. In this case, as already indicated above, it is not absolutely necessary for a raw data measurement or an RF excitation to be performed simultaneously—this could also be coordinated alternately. According to a method according to an exemplary embodiment, an inhomogeneity of the basic magnetic field, in particular of the stray magnetic field at a secondary measurement station, is used in this case for the spatial encoding of the raw data.

By means of the disclosure, the satellite measurement stations can preferably also be configured in such a way that they are optimized specifically for particular examinations. For example, a secondary measurement station can be fashioned in the form of a chair having special retainers comprising measurement coils and/or gradient coils specifically for a breast examination or a head examination. It is also preferred to provide gynecological measurement stations or measurement stations for prostate examinations with invasive RF probes and a gradient system specifically adapted to the anatomy. Further examples would be neurological examinations, cardiac examinations, kidney examinations, abdominal examinations, angiography and musculoskeletal examinations. Interventional examinations can also be effectively performed in a secondary measurement station.

FIG. 1 shows a schematic view of a magnetic resonance tomography system 1. The latter comprises primarily the actual magnetic resonance scanner 2 having a measurement station 3 or examination room 3, in this case a conventional patient tunnel 3 in which a patient O or test volunteer, i.e. the examination object O, is positioned on a couch 8. Generally, however, the whole patient O is not scanned, but only a region of interest within the patient O is measured, i.e. raw data is acquired from this region only.

The magnetic resonance scanner 2 is equipped in the conventional manner with a basic field magnet system 4, a gradient system 6, as well as an RF transmit antenna system 5 and an RF receive antenna system 7. In the exemplary embodiment shown, the RF transmit antenna system 5 is a whole-body coil permanently integrated in the magnetic resonance scanner 2, whereas the RF receive antenna system 7 consists of local coils that are to be placed on the patient or test volunteer. In principle, however, the whole-body coil can also be used as an RF receive antenna system and the local coils as an RF transmit antenna system if said coils can in each case be switched into different modes of operation. The basic field magnet system 4 is in this case embodied in the conventional manner in such a way that it generates a basic magnetic field in the longitudinal direction of the patient, i.e. along the longitudinal axis of the magnetic resonance scanner 2 extending in the z-direction. The gradient system 6 comprises in the conventional manner individually drivable gradient coils so that gradients can be switched independently of one another in the x-, y- or z-direction. The magnetic resonance scanner 2 may furthermore comprise shim coils (not shown) which may be embodied in the conventional manner.

The magnetic resonance tomography system 1 additionally comprises a central controller 13, which is used for controlling the MR system 1. Said central controller 13 comprises a sequence controller 14. The latter is used to control the sequence of radiofrequency pulses (RF pulses) and gradient pulses as a function of a chosen pulse sequence or a series of multiple pulse sequences for scanning a plurality of slices in a volume region of interest of the examination object within a measurement session. Such a pulse sequence may be predefined and parameterized within a measurement or control protocol, for example. Typically, a range of control protocols for different measurements or measurement sessions are stored in a memory 19 and can be selected (and possibly modified as necessary) by an operator and then used for performing the measurement. In the present case the controller 13 contains pulse sequences for measuring the raw data, i.e. for exciting the MR signals used for the acquisition of the raw data.

In order to emit the individual RF pulses of a pulse sequence, the central controller 13 has a radiofrequency transmitter 15 which generates and amplifies the RF pulses and feeds them into the RF transmit antenna system 5 via a suitable interface (not shown in detail). The controller 13 has a gradient system interface (GSI) 16 for the purpose of controlling the gradient coils of the gradient system 6 in order to switch the gradient pulses in a coordinated manner in accordance with the predefined pulse sequence. The sequence controller 14 communicates in a suitable manner with the radiofrequency transmitter 15 and the gradient system interface 16, e.g. by transmitting sequence control data SD, in order to execute the pulse sequence.

The controller 13 also has a radiofrequency receiver 17 (likewise communicating in a suitable manner with the sequence controller 14) in order to receive magnetic resonance signals within the readout windows predefined by the pulse sequence in a coordinated manner by means of the RF receive antenna system 7 and thus acquire the raw data.

A reconstructor 18 in this case imports the acquired raw data and reconstructs magnetic resonance image data therefrom. Generally, this reconstruction is also performed on the basis of parameters that may be predefined in the respective measurement or control protocol. Said image data may then be stored in a memory 19, for example.

The details of how RF pulses are applied and gradient pulses switched in order to acquire suitable raw data and reconstruct MR images or parameter maps therefrom are generally known to the person skilled in the art and will therefore not be explained in further depth here.

The central controller 13 can be operated by way of a terminal 11 having an input 10 and a display 9, thus enabling the entire magnetic resonance tomography system 1 also to be controlled by an operator. Magnetic resonance tomography images may also be displayed on the display 9, and measurements can be planned and started by means of the input 10, possibly in combination with the display 9, and in particular control protocols can be selected and modified if necessary.

Such a magnetic resonance tomography system 1 and in particular the controller 13 may furthermore also comprise a plurality of further components that are not shown here specifically, but are typically present in installations of said type, such as, for example, a network interface in order to connect the system as a whole to a network and to enable raw data and/or image data or parameter maps, as well as further data, such as, for example, patient-related data or control protocols, to be exchanged. In an exemplary embodiment, the controller 13 (and/or one or more of the components therein) includes processor circuitry that is configured to perform one or more functions and or operations of the controller 13.

Figure 2:
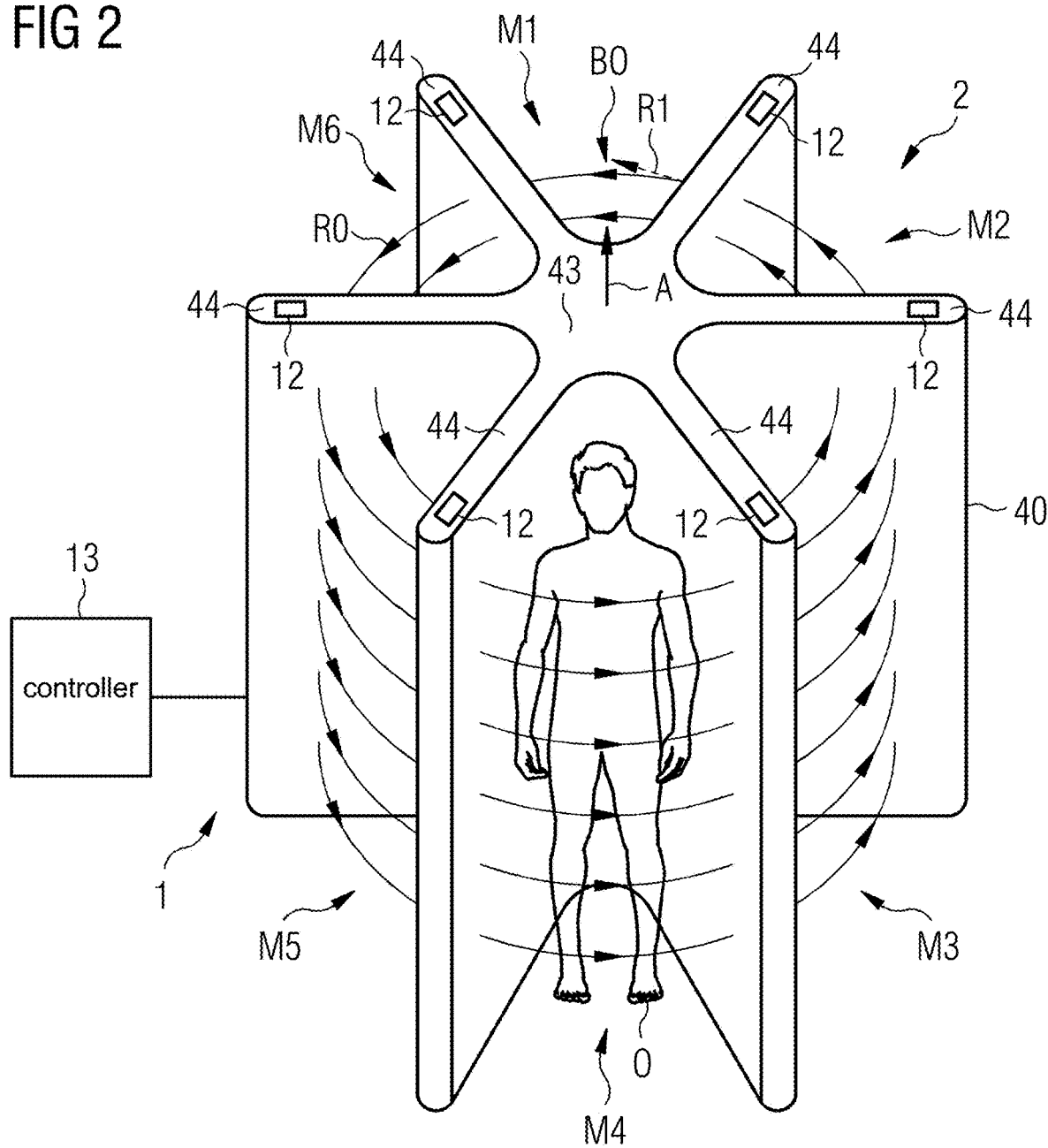
FIG. 2 shows a simplified view of a magnetic resonance tomography system having a first basic field magnet arrangement according to an exemplary embodiment.

FIG. 2 shows an exemplary embodiment of a magnetic resonance tomography system 1 according to the first main variant of the disclosure having a preferred basic field magnet arrangement 40 in which a plurality of measurement stations can be used within a main field region of the basic magnetic field of said basic field magnet arrangement 40.

Depicted in this figure is a magnetic resonance scanner 2, the operation of which can be controlled by a controller 13. In this case the controller 13 may in principle be constructed in a similar manner to and have the same components as the controller 13 in a conventional MR system according to FIG. 1. Equally, said device may also have a suitable terminal or the like (though this is not shown here).

The basic field magnet arrangement 40 of the magnetic resonance scanner 2 in this case comprises six (in this example, identical) basic field magnet segments 44, which in this embodiment variant are arranged in a star shape around a central axis A having a rotational symmetry of 60°. The basic magnetic field B0 indicated by arrows has a basic field main direction R0, which extends in the shape of a circle or a toroidal magnetic field.

Figure 3:
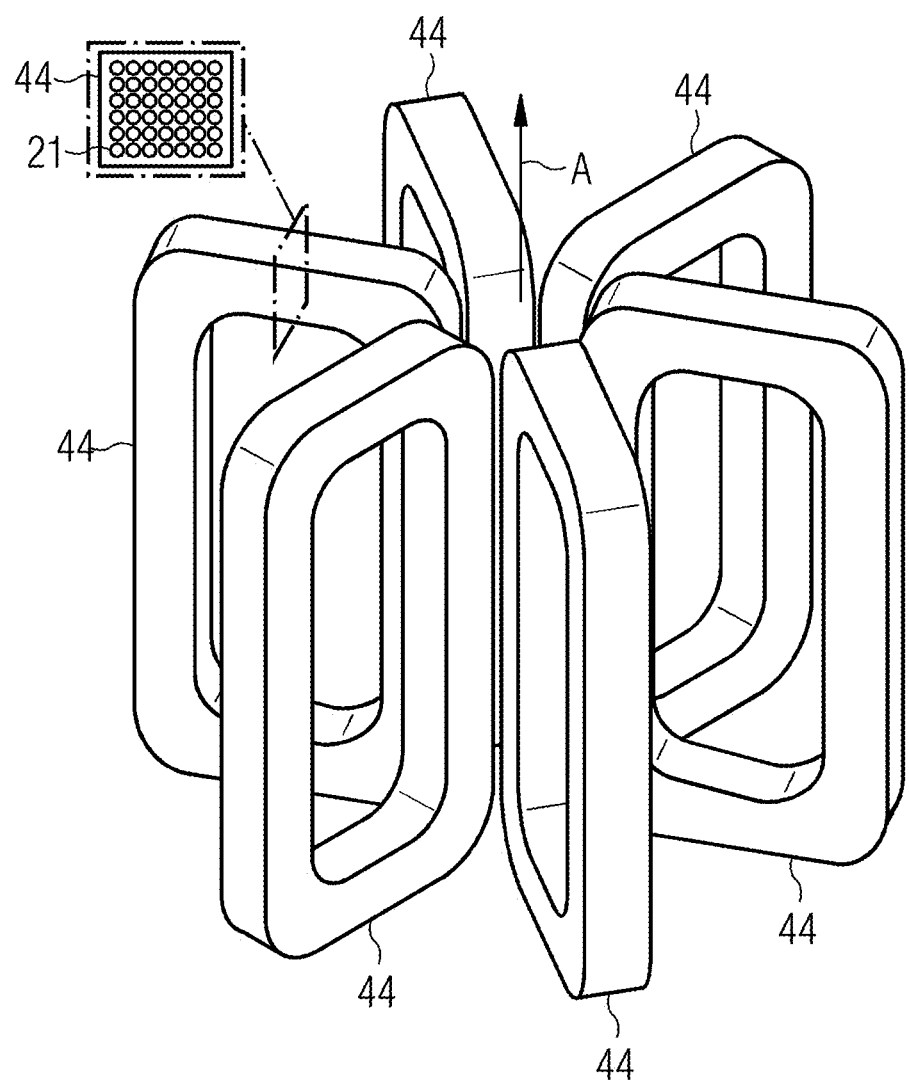
FIG. 3 shows a schematic view of a basic field magnet arrangement according to an exemplary embodiment that may be used in the system of FIG. 2.

FIG. 3 shows in this regard a detailed schematic view of the individual basic field magnet segments 44 of the star-shaped basic field magnet arrangement 40 in FIG. 2.

What can be seen here are six Helmholtz coils as basic field magnet segments 44 of the basic field magnet arrangement 40. They are oriented by one edge of their coil or winding plane toward the central axis A. Each individual basic field magnet segment 44 has an as-intended magnetic field corresponding to that of a (relatively short) solenoid, i.e. the segment main field direction R1 (shown in the view in FIG. 2 only on one of the two basic field magnet segments 44 at the rear) of the magnetic field generated by an individual basic field magnet segment 44 would in each case stand perpendicularly to the end face of the basic field magnet segment 44 in question and extend tangentially to the basic magnet main field direction R0. Collectively, the individual magnetic fields of the basic field magnet segments 44 result in the basic magnetic field B0 indicated in FIG. 2 having a toroidal basic magnet main field direction R0, the segment main field direction R1 in the center of the individual basic field magnet segments 44 in each case standing "tangentially" to the circular basic magnet main field direction R0. The basic magnetic field B0 decreases toward the outside in the radial direction, although it is homogeneous in terms of height.

The basic field magnet segments 44 of the basic field magnet arrangement 40 are interleaved with one another in such a way that a direct current flows from one basic field magnet segment 44 into the next, the current direction through the magnet windings being always the same and the circular magnetic field B0 being formed by the current flow as a whole.

A significant advantage of such a symmetric arrangement is the structural stability achieved when the basic magnetic field B0 is turned on. The magnetic forces between the individual basic field magnet segments 44 cancel one another out in the direction of the basic magnet main field direction R0. Each basic field magnet segment 44 is attracted by the same force by each of its two neighbors. The resulting forces act inwardly toward the column 43 and can be compensated for very effectively there by means of corresponding structural reinforcements.

The inset shown in magnified form in the top left-hand corner of FIG. 3 is a section through a basic field magnet segment 44. What can be seen is a regular arrangement of electric current conductors 21, which are drawn here as wires, but may by all means have a complex structure, e.g. may be hollow in order to conduct a coolant.

Such a magnetic resonance tomography system 1 having a basic field magnet arrangement 40 according to FIGS. 2 and 3 permits measurements at six different measurement stations M1, M2, M3, M4, M5, M6 (see FIG. 2), wherein a measurement of an object O takes place in the illustrated example specifically at measurement station M4, wherein a patient is in this case standing upright at vertical walls of the basic field magnet arrangement 40. Theoretically, measurements could take place at all six measurement stations M1, M2, M3, M4, M5, M6 simultaneously. A central column 43 holds the basic field magnet segments 44 in place and may also comprise technical components, such as e.g. the electrical connections or even the power supply (see e.g. FIG. 4).

At each of the measurement stations M1, M2, M3, M4, M5, M6 there may be disposed measuring devices 12 (only represented symbolically in each case) or the components necessary for this at the measurement station M1, M2, M3, M4, M5, M6 in each case, such as an RF transmit coil of an RF transmit system, an RF receive coil of an RF receive system and/or a common RF transmit/receive coil. Gradient and/or shim coils 6a may also belong to this. All these components can be actuated in a coordinated manner by the common controller 13.

A magnetic resonance scanner 2 may of course also comprise more than six measurement stations M1, M2, M3, M4, M5, M6, its height may be lower or it is configured for conducting examinations of small regions of the body, e.g. for head examinations or examinations of the extremities, of the female breast, the prostate, the liver, kidneys or other organs. The star-shaped basic field magnet arrangement 40 could also be disposed in a lying position.

Figure 4:
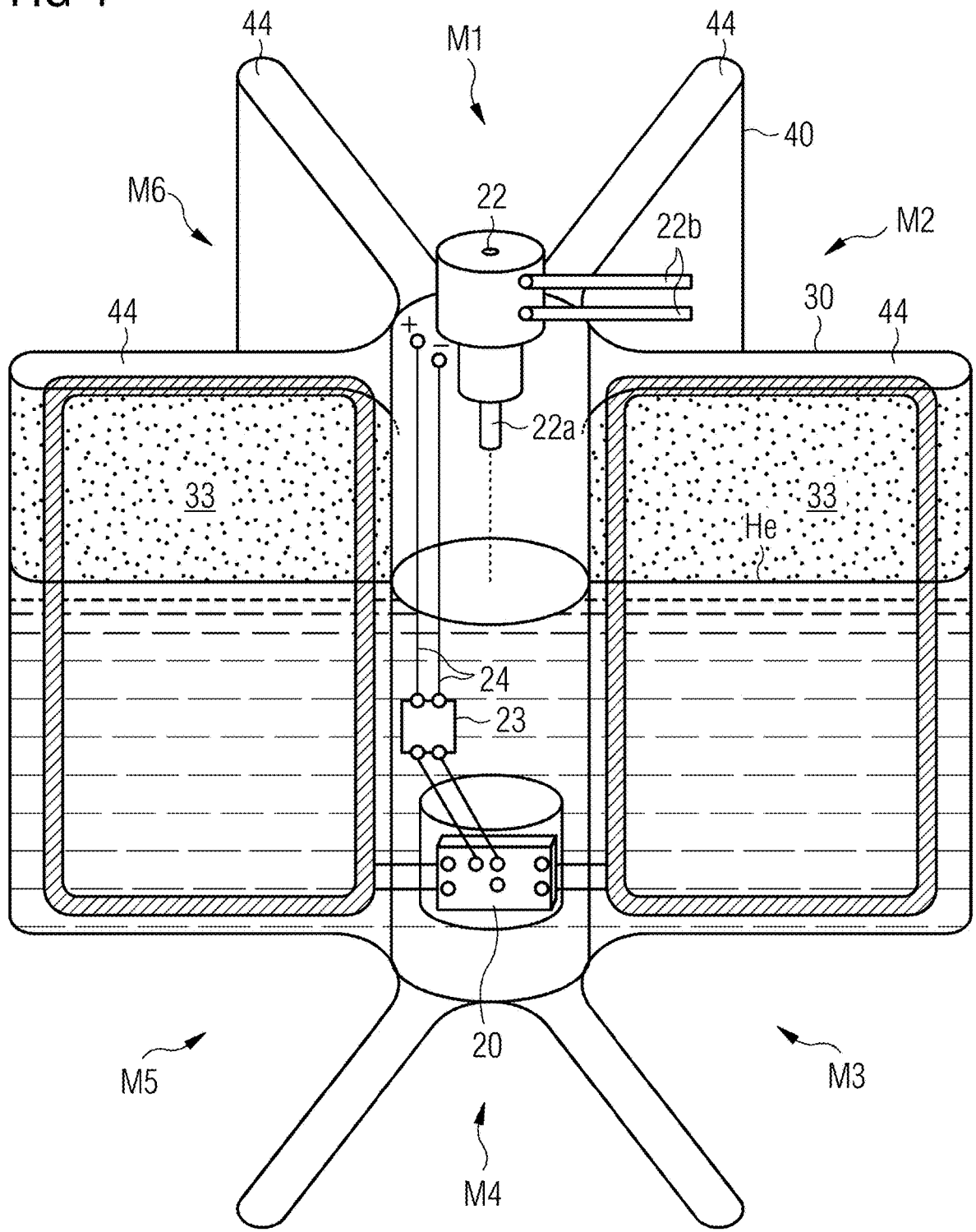
FIG. 4 shows a more detailed view of a basic field magnet arrangement according to an exemplary embodiment that may be used in the system of FIG. 2.

FIG. 4 shows an exemplary embodiment of a magnetic resonance tomography system 1 having a superconducting basic field magnet arrangement 40. This could be a superconducting version of the embodiment variant shown in FIG. 2. To provide a better illustration of the internal structure, the front two basic field magnet segments 44 are not shown. It can be seen that the basic field magnet arrangement 40 is filled with helium He which is partially liquid and partially gaseous. Here, the reference sign for the helium He points to the liquid level. The entire basic magnetic field arrangement 40 is surrounded by a housing wall 30 which in this case includes in particular a thermal insulation means so that the helium He in the housing interior 33 remains cold and therefore liquid.

Such an insulation means may comprise e.g. multilayer insulating foils or thermally conductive shields against ambient thermal radiation.

Mounted at the top in the center of the basic field magnet arrangement 40 is a cooler 22 having a cooling finger 22a on which helium He constantly condenses and drips downward. The helium content and the pressure in the basic field magnet arrangement 40 can be regulated by means of a helium line 22b. Shown at the bottom is a superconducting joints box 20 connected to a switch 23 which can supply the basic field magnet arrangement 40 with electric current via power supply leads 24. The switch 23 can be used here as a persistent switch in order to generate a constantly circulating current and consequently a permanent basic magnetic field B0 in the superconducting basic field magnet arrangement 40.

However, other cooling alternatives are also possible, e.g. cooling by passing liquid helium through hollow conductors of the magnets or by means of additional cooling lines in good thermal contact with the magnetic coils. Further components (not shown here for clarity of illustration reasons) may also be included in the construction of the basic field magnet arrangement 40, such as e.g. a quench detector or protector, a so-called "coil carrier" (magnet former) or structural reinforcements.

Figure 5:
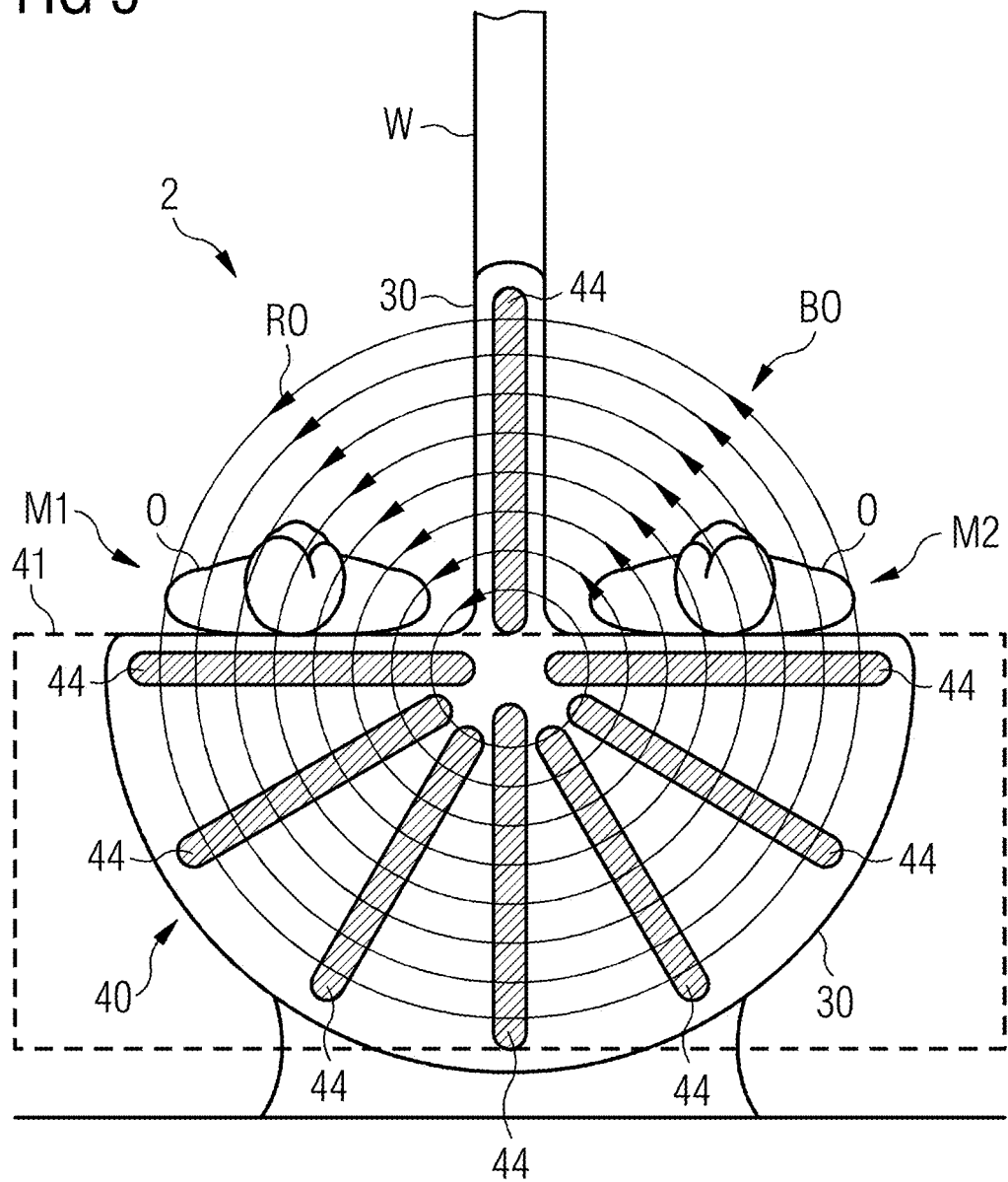
FIG. 5 shows a magnetic resonance tomography system having a basic field magnet arrangement according to an exemplary embodiment.

FIG. 5 shows a further exemplary embodiment of a magnetic resonance scanner 2 having a preferred basic field magnet arrangement 40. Here, only the lower half of the basic field magnet arrangement 40 is designed as a group 41 of basic field magnet segments 44 in the shape of a star and a further basic field magnet segment 44 projects upward and serves both for guiding the basic magnetic field B0 and also as part of a wall W between two measurement stations M1, M2 on which two patients O are positioned in this case. In the diagram it can be seen that the lower part of the wall W between the two patients O is formed by the housing wall 30 of the magnetic resonance scanner 2 into which the basic field magnet segment 44 is integrated between the measurement stations M1, M2. The wall W may serve not only as a privacy screen, but also as an acoustic shield or an RF shield.

The basic magnetic field B0 of said magnetic resonance scanner 2 becomes weaker toward the outside, which may be used for spatial encoding, and is homogeneous in the longitudinal direction (orthogonally to the image plane). It is basically identical in terms of its shape in the two measurement stations M1, M2, with the only difference being that the profile (in a direction through the surface on which the patient O is supported) is reversed. In this case too, as in FIG. 2, the dimensions of the magnetic resonance scanner 2 may by all means be chosen differently.

The basic magnet main field direction R0 is circular in this case also. A special feature in this embodiment variant is that the patients O do not lie in a confined space, but have an unobstructed view toward the ceiling. The inhomogeneity normally produced in the basic magnetic field B0 due to the curvature can be used, as mentioned, for the spatial encoding of a spatial direction such that for the spatial encoding as a whole it is simply necessary to apply gradients in the other spatial direction.

Owing to its open design and the toroidal magnetic field, this arrangement allows easy and largely unrestricted access to the patient. Thanks to the special construction, magnetic forces as in FIG. 2 are largely compensated for or are diverted into areas which can be structurally strengthened to good effect.

Figure 6:
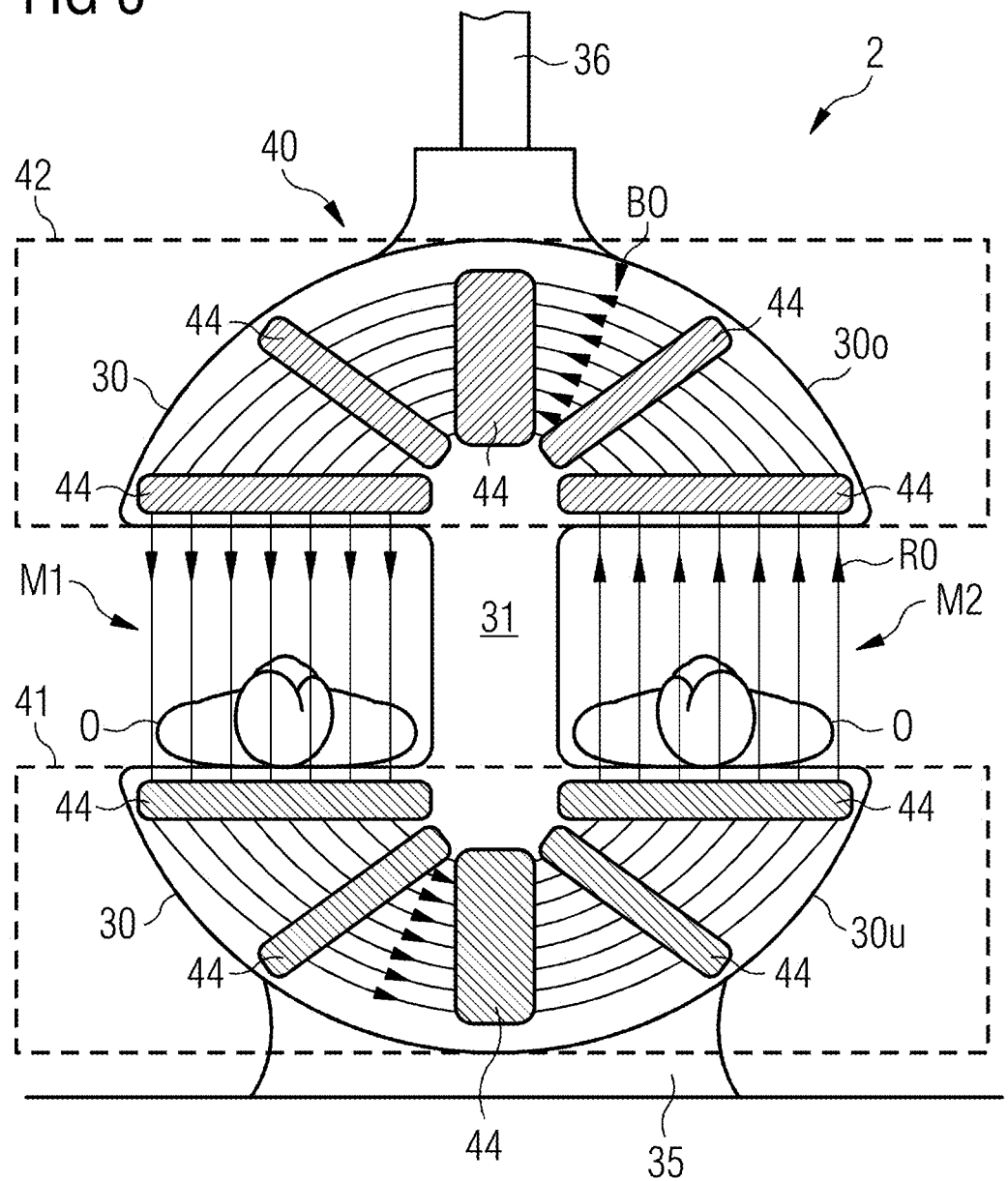
FIG. 6 shows a magnetic resonance tomography system having a basic field magnet arrangement according to an exemplary embodiment.

FIG. 6 shows a further exemplary embodiment of a magnetic resonance scanner 2 having a preferred basic field magnet arrangement 40. This is similar in construction to that in FIG. 5, with the difference that a group 41, 42 of basic field magnet segments 44 is now located above and below the two measurement stations M1, M2. As can be seen from the indicated profile of the magnetic field lines, the profile of the intended basic magnetic field B0 is very homogeneous here in the region of the measurement stations M1, M2.

The housing 30 in this case comprises a lower and an upper semicylindrical housing section 30u, 30o, each having a cross-section in the shape of a 180° circular segment, in each of which a group 41, 42 of basic field magnet segments 44 is accommodated. The groups 41, 42 of basic field magnet segments 44 are kept spaced apart from one another by means of a central bridge or demarcation element 31 which is part of the housing 30, the semicylinders of the housing sections 30u, 30o each facing toward one another with their flat side, thereby providing two measurement stations M1, M2 between the housing sections 30u, 30o. The lower semicylindrical housing section 30u stands on a base part 35 and the upper semicylindrical housing section 30o can be additionally secured by a ceiling-mounted retaining fixture 36. In this arrangement, the demarcation element 31 serves simultaneously as a partition or wall W between the two measurement stations M1, M2.

Compared with the construction according to FIG. 5, the construction shown here is aimed at generating a homogeneous magnetic field at the two measurement stations M1, M2. The spatial openness of such a magnetic resonance scanner 2 is comparable with a C magnet system, though in contrast to such a system there is no need for a solid iron yoke for shielding or redirecting the magnetic field lines. Instead, the group 41, 42 of basic field magnet segments 44 is used for shielding and guiding the basic magnetic field B0, thus significantly reducing the weight.

Figure 7:
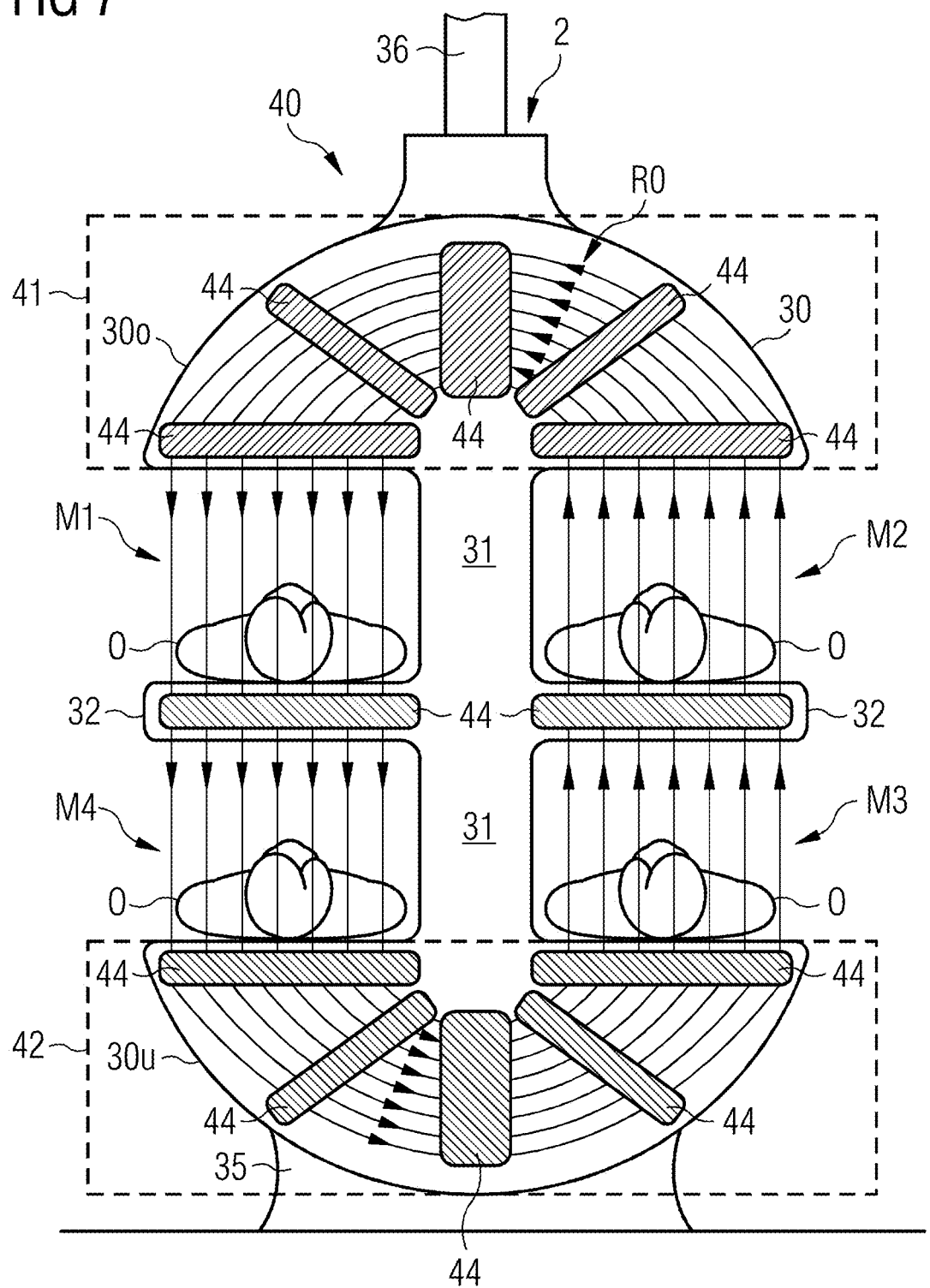
FIG. 7 shows a magnetic resonance tomography system having a basic field magnet arrangement according to an exemplary embodiment.

FIG. 7 shows a further exemplary embodiment of a magnetic resonance tomography system 1 having a preferred basic field magnet arrangement 40. This is very similar to the construction according to FIG. 6, with the difference that in this case there are now four measurement stations M1, M2, M3, M4 present instead of two. Two of the measurement stations M1, M2, M3, M4 are arranged one above the other in each case, the upper one being separated from the lower one in each case by means of a floor element 32 of the housing 30. Said floor element 32 simultaneously serves as a receptacle for a basic field magnet segment 44 which guides the magnetic field in the magnetic resonance scanner 2 homogeneously through the measurement stations M1, M2, M3, M4. The floor elements 32 may for example be anchored to the central ridge or demarcation element 31 of the housing 30 serving as a partition or wall W between the respective neighboring measurement stations M1, M2, M3, M4 or extend sideways out of the same.

Figure 8:
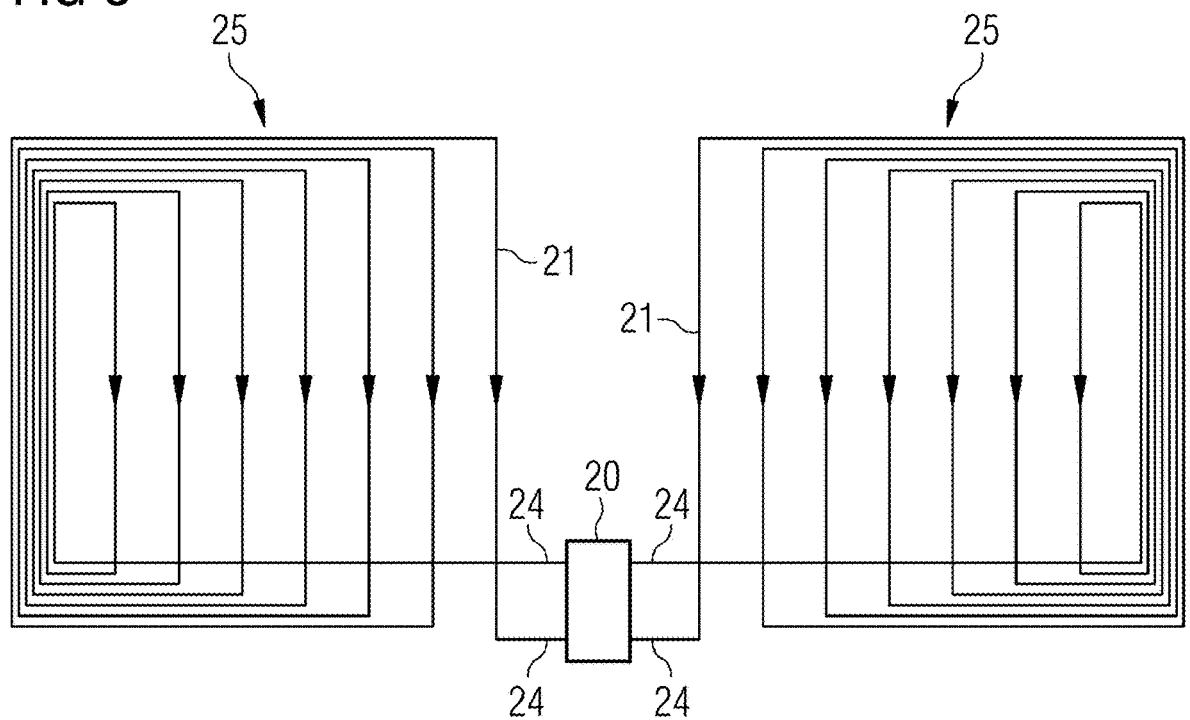
FIG. 8 shows a coil winding according to an exemplary embodiment that may be used in the basic field magnet arrangements according to FIGS. 1 to 7.

FIG. 8 shows a schematic view of coil windings 25 composed of electric current conductors 21 for compensating for inhomogeneities in an annular magnetic field, as may be used within the scope of the disclosure. It is possible to visualize said windings being present in oppositely disposed basic field magnet segments 44 in FIG. 3. As can clearly be seen, the coil windings 25 are designed in such a way that the diameter of a winding decreases in one spatial direction (namely the horizontal in this case) compared with its neighbor winding, and its center point lies closer to an outside edge of the annular basic magnetic field B0 than the center point of the larger winding. As a result, an intended magnetic field (of a respective basic field magnet segment 44) is generated which becomes stronger in each case toward the outside faces of the basic field magnet segments 44. Given a suitable construction, this enables the inhomogeneity of the basic magnetic field B0 extending in the radial direction, as described in connection with FIGS. 2, 3 and 5, to be compensated for, at least partially, preferably completely.

Figure 9:
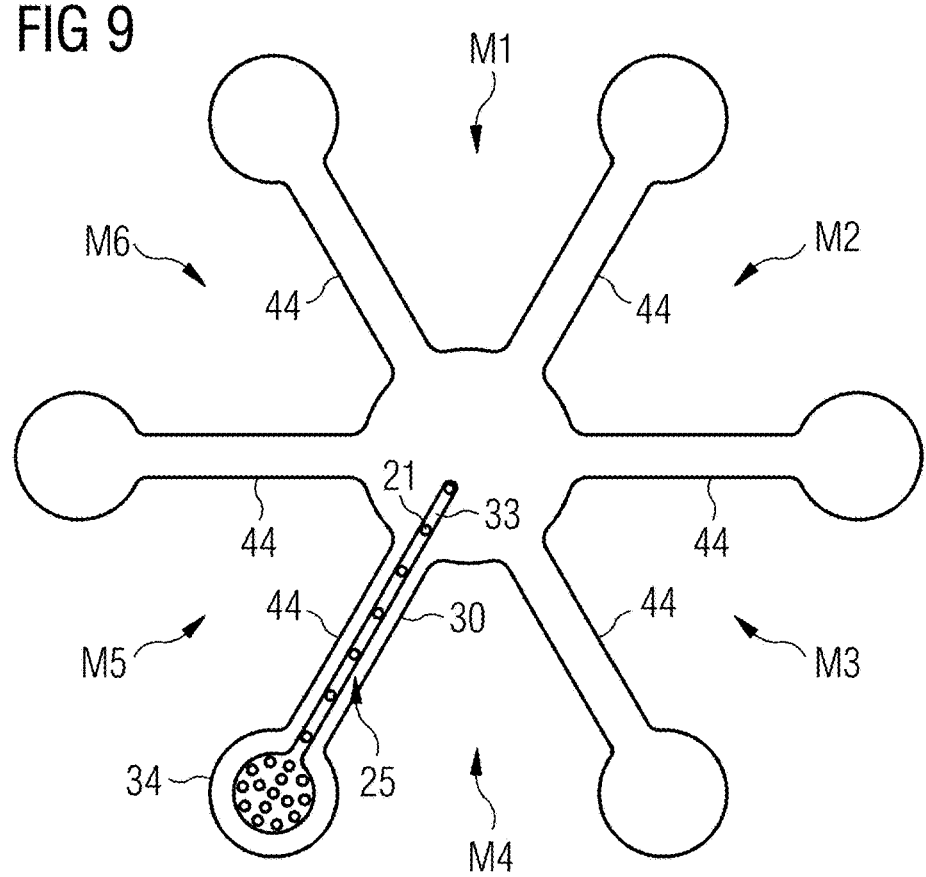
FIG. 9 shows a detailed view of a basic field magnet arrangement according to an exemplary embodiment and similar to that in FIG. 2, but now having a coil winding as in FIG. 8.

FIG. 9 shows a schematic view from above onto an embodiment variant illustrated in FIG. 2 having a coil winding 25 according to FIG. 8. Only one basic field magnet segment 44 is provided with a detail drawing in this case. It should be assumed that all the other basic field magnet segments 44 are also constructed in such a way.

The density of the electric current conductors 21 may also increase with increasing radial distance.

The coil winding 25 is accommodated in a housing interior 33 of the housing 30. Since the number of electric current conductors 21 (for clarity of illustration reasons, only one is designated) is very high at the edge, and otherwise the density is regular across the width of a basic field magnet segment 44, said basic field magnet arrangement 40 has thicker extremities in which the electric current conductors are routed in a bundled manner at the outer end sections 34 of the side walls of the basic field magnet segments 44.

Referring to the following figures, various exemplary embodiments will now be explained very schematically in each case, wherein, as already mentioned above, "secondary" measurement stations Ms or "satellite measurement stations" are used which are located in an unshielded or at best weakly shielded stray field of the basic magnetic field of the basic field magnet arrangement. A "primary" measurement station Mp is disposed in each case in the basic field magnet arrangement itself or in the main field region of the basic magnetic field.

Figure 10:
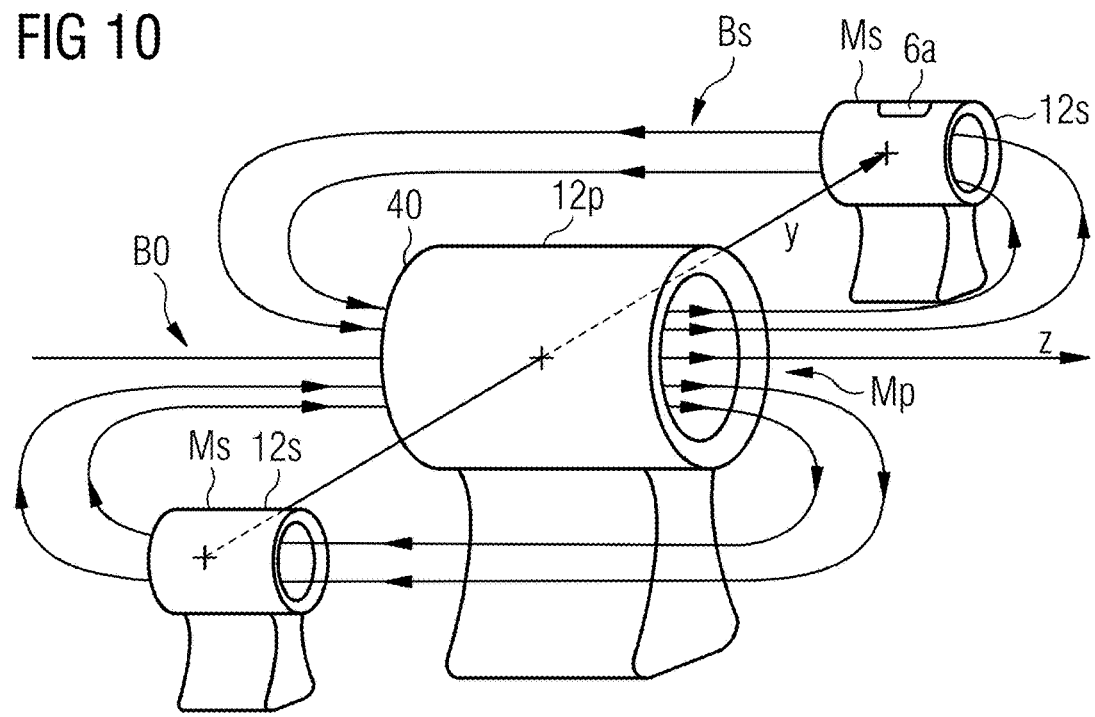
FIG. 10 shows a magnetic resonance tomography system having two secondary measurement stations according to an exemplary embodiment.

FIG. 10 shows a first exemplary embodiment of such a magnetic resonance tomography system 1 according to the disclosure. The primary measurement station Mp is in this case disposed in a relatively simple basic field magnet arrangement 40 which for example has only one basic field magnet in the form of a (in particular superconducting) solenoid. This causes a highly homogeneous basic magnetic field B0 to be generated at the primary measurement station Mp, with which very accurate measurements are possible with a measuring device 12*p*. Said basic field magnet of the basic field magnet arrangement 40 may in principle be constructed like the basic field magnet 4 from FIG. 1, apart from a modified or partially non-existent magnetic field shield. All other components, as have been explained in the context of FIG. 1, may also be present at the primary measurement station Mp.

Outside of the basic field magnet arrangement 40, there is indicated in FIG. 10 a stray magnetic field Bs in which two secondary measurement stations Ms are arranged in this case. All components, as have been explained in the context of FIG. 1, except for a further basic field magnet 4, may likewise be present at said secondary stations. These "satellite measurement stations" Ms have in particular a measuring device 12*s*.

Given a basic field of 3 T, a conventional shielded basic field magnet would still have a field strength of 50 mT in the stray field Bs at a distance of 1.5 m. If the shielding is omitted, as is the case here with the basic field magnet arrangement 40, then the strength in the stray magnetic field Bs would increase considerably. For example, a field strength of approx. 0.5 T at a distance of 1 m or of approx. 100 mT at a distance of 4 m is still present here at the satellite measurement stations Ms.

The two satellite measurement stations Ms could have a much larger patient tunnel (e.g. 80 cm) and be embodied shorter in length (e.g. 1 m) than the primary measurement station Mp. This has an advantageous effect in terms of avoiding claustrophobic anxieties.

The wall thickness of the satellite measurement stations Ms may be of thinner construction e.g. when an unshielded gradient system 6 is used. This is possible because of the comparatively great distance from the basic field magnet arrangement 40.

In order to compensate for unwanted inhomogeneities in the stray field Bs, the secondary measurement stations Ms may comprise a shim coil system 6a (shown only at the rear satellite measurement station Ms in FIG. 10). This can be an independent coil system or be realized as part of a gradient system 6 (see FIG. 1).

Figure 11:
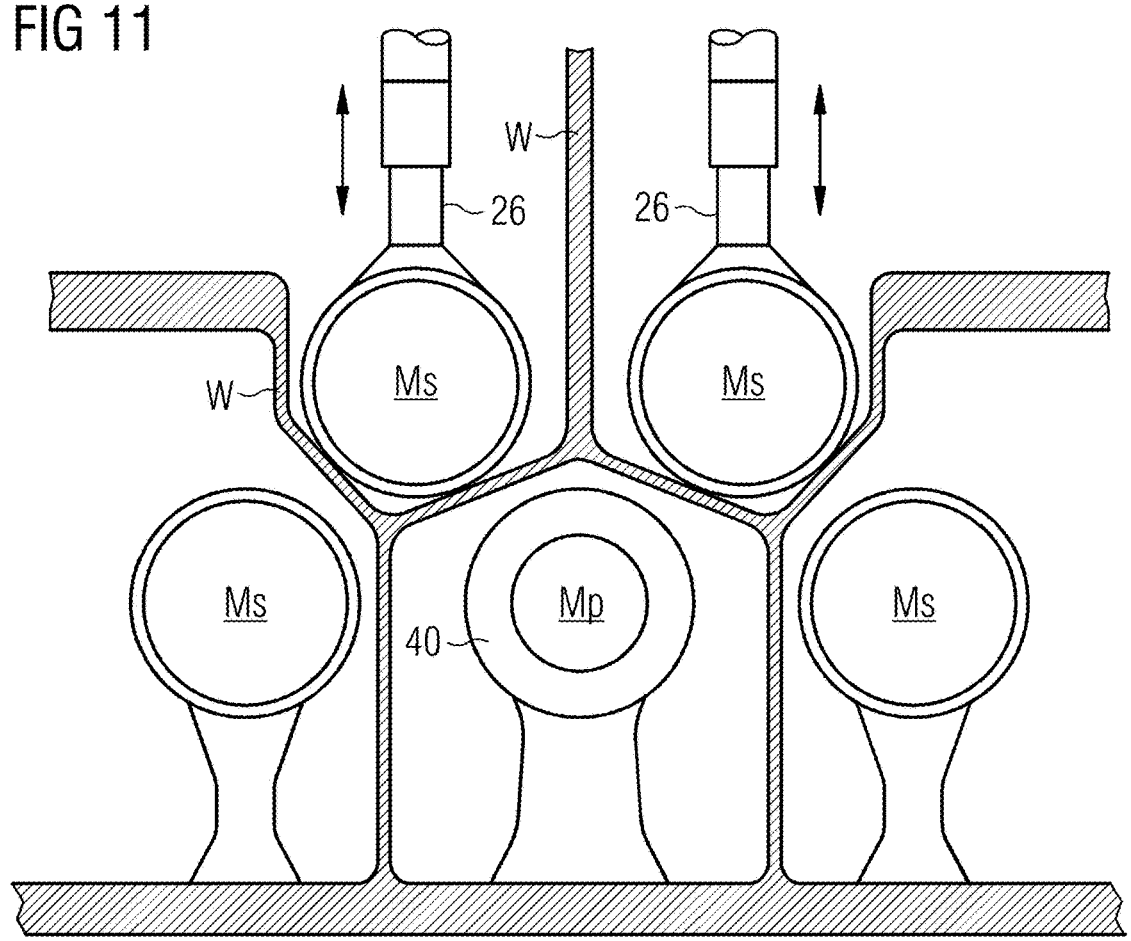
FIG. 11 shows a magnetic resonance tomography system having a total of four secondary measurement stations according to an exemplary embodiment.

FIG. 11 shows a further exemplary embodiment of a magnetic resonance tomography system 1 according to the disclosure. In addition to the primary measurement station Mp, four secondary measurement stations Ms are arranged here in such a way that the stray magnetic field Bs of the basic field magnet arrangement 40 of the primary measurement station Mp can be used for measurements at the secondary measurement stations Ms. The measurement stations Mp, Ms are separated from one another by walls W (side walls or ceilings) and in this case are all located in different rooms, thus preserving privacy. The walls W are preferably implemented as a Faraday cage in order to avoid RF crosstalk. In addition, the walls also serve as an advantageous acoustic insulation and optical shielding means.

In order to bring the top two secondary measurement stations Ms into areas of maximum field strength of the stray magnetic field Bs, these can be lowered by way of a height adjustment facility 26 into cavities (arrows) for the purpose of a measurement.

With such an arrangement, up to five patients can be examined simultaneously, the best results obviously being achieved at the primary measurement station MP. As already in the case of the previously described arrangement, the basic field magnet 4 requires no shielding and the patient tunnel of the secondary measurement stations Ms can be dimensioned larger, i.e. with a field of view having a greater diameter and having a shorter longitudinal dimension.

Figure 12:
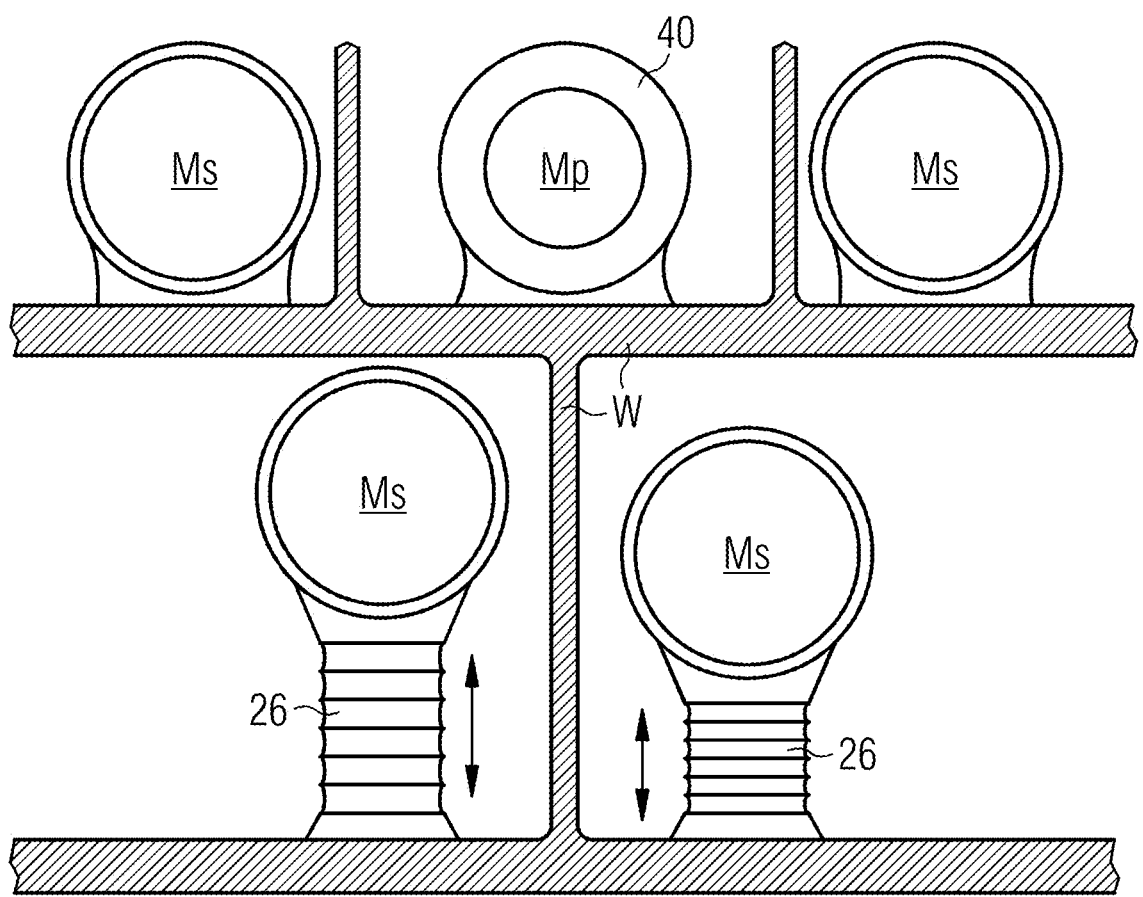
FIG. 12 shows a magnetic resonance tomography system having a total of four secondary measurement stations according to an exemplary embodiment.

FIG. 12 shows a further exemplary embodiment of a magnetic resonance tomography system 1 according to the disclosure. It is very similar to FIG. 11, with the difference that in this case the primary measurement station Mp is located at the top and two lower-lying secondary measurement stations Ms can be raised upward by means of a height adjustment facility 26.

A height adjustment facility 26 can be realized for example by means of pneumatic actuators, which are preferably controlled automatically.

Such a height adjustment facility 26 also permits MR scans to be performed at different field intensities, in particular for a method known as "field cycling", and enables very good imaging of the distribution of a contrast agent in a patient.

Figure 13:
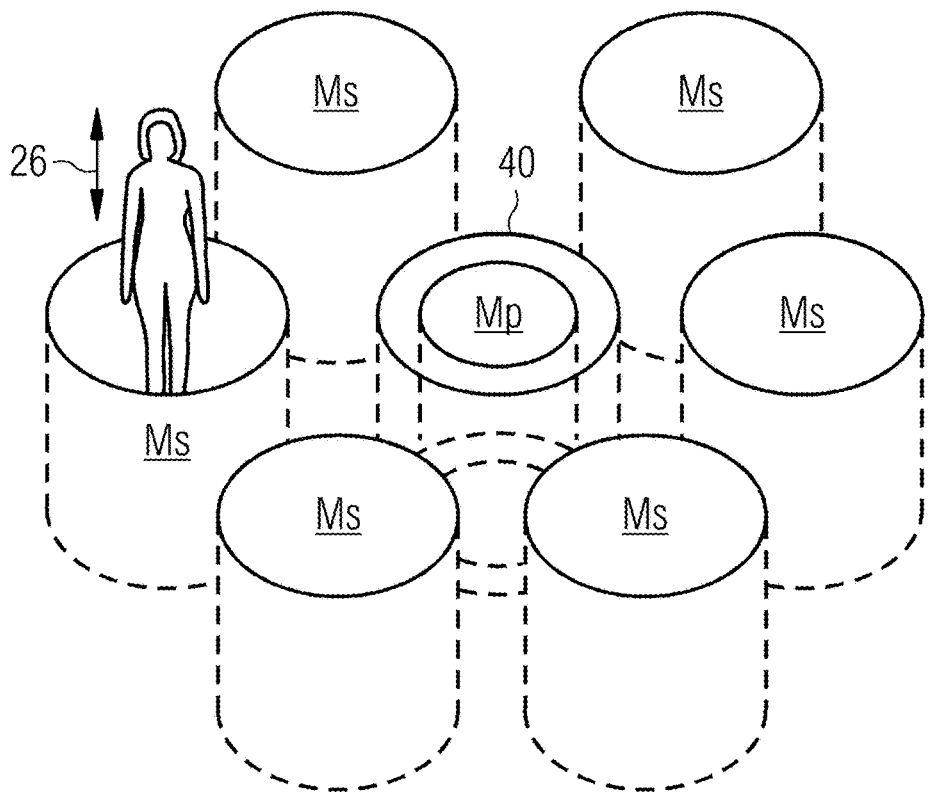
FIG. 13 shows a magnetic resonance tomography system having a star-shaped arrangement of a total of six secondary measurement stations in an upright position according to an exemplary embodiment.

FIG. 13 shows a further exemplary embodiment of a magnetic resonance tomography system 1 according to the disclosure having a primary measurement station Mp standing upright and six secondary measurement stations Ms, likewise standing upright, arranged around it in a star shape. With such an arrangement it would be possible e.g. to carry out examinations of the spine.

A height adjustment facility 26 enables patients to reach the measurement stations Mp, Ms, e.g. on a platform or by means of a vertical "patient couch" specifically provided with retaining fixtures. The patient can then be lifted upward again following completion of a measurement.

Figure 14:
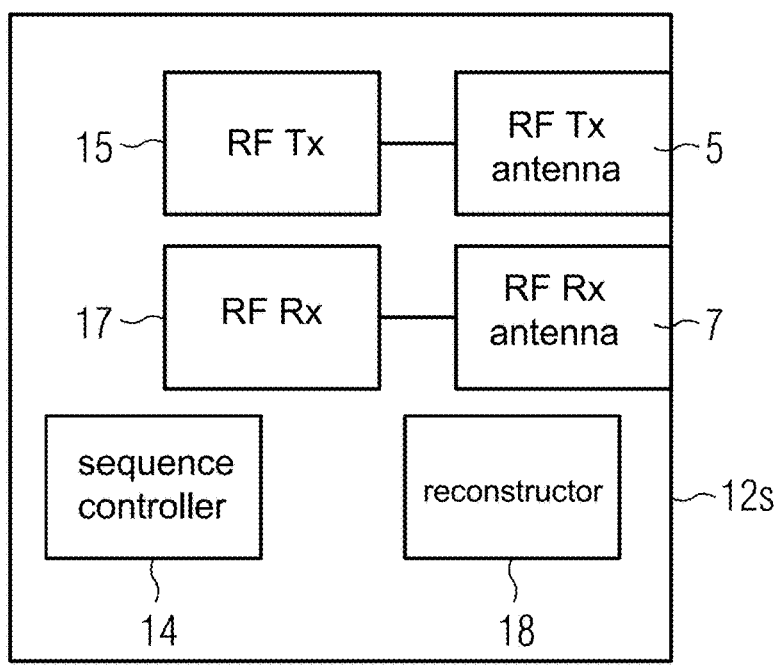
FIG. 14 shows a schematic block diagram of a measuring device according to an exemplary embodiment.

FIG. 14 shows a rough schematic block diagram illustrating an inventive measuring device 12s, such as may be arranged e.g. at a satellite measurement station Ms. Said device comprises an RF transmit system having an RF transmit antenna system 5 and a radiofrequency transmitter 15, an RF receive system having an RF receive antenna system 7, as well as a radiofrequency receiver 17, a sequence controller 14 and a reconstructor 18. Basically, the measuring device requires no unit for generating its own basic magnetic field, e.g. no U-shaped magnetic field of a permanent magnet, because it can of course use the stray magnetic field of an existing basic field magnet arrangement. Said measuring device could also be constructed in a mobile design in order to equip different secondary measurement stations temporarily with a measuring device. For example, the measuring device may be designed as a portable device which e.g. can fit comfortably in one hand.

FIG. 15 shows a mobile or modular embodiment variant of an MR system 1 in a container. The secondary measurement stations Ms may be located next to said container, e.g. in further containers (indicated by dashed lines). The containers should have no ferromagnetic walls so that the stray magnetic field Bs can easily reach the secondary measurement stations. Treatment rooms according to FIG. 11 or 12 can be realized very easily and quickly with such a modular design constructed by means of containers.

In conclusion, it is pointed out once again that the methods described in detail in the foregoing, as well as the illustrated magnetic resonance tomography systems 1 or measuring devices, are simply exemplary embodiments which may be modified in the most diverse ways by the person skilled in the art without leaving the scope of the disclosure. Thus, for example, as already mentioned, it would also be possible in a magnetic resonance tomography system comprising a plurality of (primary) measurement stations in the main field region of the basic magnetic field or in the basic field magnet arrangement itself (as is the case with the first main variant of the disclosure) for additional satellite measurement stations to be arranged in the stray field (as is the case with the second main variant of the disclosure), depending on how the basic magnetic field is constructed and shielded or, as the case may be, is specifically intentionally not shielded. Furthermore, the use of the indefinite articles "a" or "an" does not exclude the possibility that the features in question may also be present more than once. Similarly, the terms "unit" and "device" do not rule out the possibility that the components in question consist of a plurality of cooperating subcomponents, which if necessary may also be distributed in space.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A magnetic resonance tomography system comprising:
a basic field magnet arrangement configured to generate a basic magnetic field; and
a plurality of spatially separated measurement stations, wherein the magnetic resonance tomography system is configured to use the basic magnetic field collectively for the plurality of spatially separated measurement stations, wherein at least one measurement station of the plurality of spatially separated measurement stations comprises a height adjuster configured to adjust a height of the entire measurement station and/or adjust a height of an examination object.

2. The magnetic resonance tomography system as claimed in claim 1, wherein the magnetic resonance tomography system is configured to perform magnetic resonance tomography scans simultaneously at at least two of the plurality of spatially separated measurement stations in the common basic magnetic field.

3. The magnetic resonance tomography system as claimed in claim 1, wherein the at least one measurement stations is a secondary measurement station of the plurality of spatially separated measurement stations.

4. The magnetic resonance tomography system as claimed in claim 1, further comprising at least two measuring devices, independent of one another, each of the at least two measuring devices being configured to perform a measurement within a scope of a magnetic resonance tomography scan at one of the plurality of spatially separated measurement stations, wherein at least one of the at least two measuring devices is a mobile measuring device.

5. The magnetic resonance tomography system as claimed in claim 4, wherein a measuring device, of the at least two measuring devices, for a secondary measurement station of the plurality of spatially separated measurement stations comprises at least one radiofrequency (RF) transmitter, at least one RF receiver, and a gradient system and/or a shim coil system.

6. A mobile measuring device configured to perform a measurement in the magnetic resonance tomography system according to claim 1, wherein the measuring device comprises at least one radiofrequency (RF) transmitter, at least one RF receiver, and a gradient system and/or a shim coil system.

7. A magnetic resonance tomography system comprising:
a basic field magnet arrangement configured to generate a basic magnetic field, the basic field magnet arrangement including a plurality of basic field magnet segments spatially separated from one another, each basic field magnet segment of the plurality of basic field magnet segments are configured to generate an intended magnetic field having a defined segment main field direction, wherein at least two basic field magnet segments of the plurality of basic field magnet segments are arranged relative to one another such that the segment main field directions of their intended magnetic fields extend at a deflection angle to one another such that the intended magnetic fields of the at least two basic field magnet segments result in the intended basic magnetic field, the basic magnetic field having a basic magnet main field direction having an annular profile; and
a plurality of spatially separated measurement stations, wherein the magnetic resonance tomography system is configured to use the basic magnetic field collectively for the plurality of spatially separated measurement stations.

8. A magnetic resonance tomography system comprising:
a basic field magnet arrangement configured to generate a basic magnetic field; and
a plurality of spatially separated measurement stations, wherein the magnetic resonance tomography system is configured to use the basic magnetic field collectively for the plurality of spatially separated measurement stations, wherein:
at least one primary measurement station, of the plurality of spatially separated measurement stations, is within the basic field magnet arrangement; and
at least one secondary measurement station, of the plurality of spatially separated measurement stations, is outside of the basic field magnet arrangement and is located in a stray field area of a stray magnetic field of the basic field magnet arrangement, the least one secondary measurement station being configured to use the stray magnetic field of the basic magnetic field.

9. The magnetic resonance tomography system as claimed in claim 8, wherein the plurality of spatially separated measurement stations comprise at least two secondary measurement stations which are arranged on different sides of the primary measurement station and lie in a common plane with the primary measurement station.

10. The magnetic resonance tomography system as claimed in claim 9, wherein the at least two secondary measurement stations are arranged in a star shape around the primary measurement station.

11. The magnetic resonance tomography system as claimed in claim 8, wherein the at least one secondary measurement station is arranged in a different room from the at least one primary measurement station.

12. The magnetic resonance tomography system as claimed in claim 8, wherein the at least one secondary measurement station is separated from the at least one primary measurement station by a wall, the wall being paramagnetic, constitutes an acoustic and/or optical separation, and/or forms a Faraday cage around at least one of the plurality of spatially separated measurement stations.

13. The magnetic resonance tomography system as claimed in claim 8, wherein a basic magnet main field direction of the basic magnetic field is oriented perpendicularly to a floor surface in a region of the at least one primary measurement station.

14. A method for measuring raw data for a magnetic resonance tomography scan, comprising:
positioning at least one examination object in a measurement station of a plurality of spatially separated measurement stations of a magnetic resonance tomography system that further includes a basic field magnet arrangement;
generating a basic magnetic field using the basic field magnet arrangement of the magnetic resonance tomography system, the basic magnetic field being collectively used for the plurality of spatially separated measurement stations, wherein a secondary measurement station of the plurality of spatially separated measurement stations is arranged in a stray field or stray field region of the basic magnetic field to facilitate a raw data measurement at the secondary measurement station using the stray field or stray field region of the basic magnetic field; and
measuring the raw data at at least the measurement station.

15. The method as claimed in claim 14, wherein at least one examination object is positioned in the secondary measurement station of the plurality of spatially separated measurement stations and raw data for magnetic resonance tomography scans is measured at said secondary measurement station using a mobile measuring device having at least one radiofrequency (RF) transmitter, at least one RF receiver, and a gradient system and/or a shim coil system, wherein magnetic resonance tomography scans are performed simultaneously at at least two measurement stations of the plurality of spatially separated measurement stations.

16. The method as claimed in claim 14, further comprising spatially encoding the raw data using an inhomogeneity of the basic magnetic field, wherein the inhomogeneity of the basic magnetic field includes a stray magnetic field at a secondary measurement station plurality of spatially separated measurement stations.

17. A non-transitory computer-readable storage medium with an executable program stored thereon, that when executed, instructs a processor to perform the method of claim 14.

18. A computer program product having a computer program which is directly loadable into a memory of the magnetic resonance tomography system, when executed by a processor of the magnetic resonance tomography system, causes the processor to perform the method as claimed in claim 14.

* * * * *